US012586987B2

(12) United States Patent
Meyer et al.

(10) Patent No.: US 12,586,987 B2
(45) Date of Patent: Mar. 24, 2026

(54) WEAK INDEX GUIDING OF INTERBAND CASCADE LASERS

(71) Applicant: The Government of the United States of America, as represented by the Secretary of the Navy, Arlington, VA (US)

(72) Inventors: Jerry R. Meyer, Catonsville, MD (US); Alexander Spott, Santa Barbara, CA (US); Chul Soo Kim, West Springfield, VA (US); Mijin Kim, West Springfield, VA (US); Chadwick L. Canedy, Washington, DC (US); Charles D. Merritt, Fairfax, VA (US); William W. Bewley, Falls Church, VA (US); Igor Vurgaftman, Severna Park, MD (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 627 days.

(21) Appl. No.: 18/149,778

(22) Filed: Jan. 4, 2023

(65) Prior Publication Data

US 2023/0231364 A1      Jul. 20, 2023

Related U.S. Application Data

(60) Provisional application No. 63/296,176, filed on Jan. 4, 2022.

(51) Int. Cl.
*H01S 5/34*          (2006.01)

(52) U.S. Cl.
CPC .......... *H01S 5/3419* (2013.01); *H01S 5/3401* (2013.01); *H01S 5/3422* (2013.01)

(58) Field of Classification Search
CPC ..... H01S 5/3401; H01S 5/3402; H01S 5/3419
See application file for complete search history.

(56) References Cited

U.S. PATENT DOCUMENTS

| | | |
|---|---|---|
| 5,374,564 A | 12/1994 | Bruel |
| 8,125,786 B2 | 2/2012 | Meyer et al. |
| 8,290,011 B2 | 10/2012 | Meyer et al. |
| 8,385,378 B2 | 2/2013 | Meyer et al. |
| 8,493,654 B2 | 7/2013 | Meyer et al. |
| 8,798,111 B2 | 8/2014 | Meyer et al. |
| 8,879,593 B2 | 11/2014 | Kim et al. |
| 9,059,570 B1 | 6/2015 | Vurgaftman et al. |

(Continued)

OTHER PUBLICATIONS

Meyer et al., Photonics 7, 75 (2020), "The Interband Cascade Laser".

(Continued)

*Primary Examiner* — James A Menefee
(74) *Attorney, Agent, or Firm* — US Naval Research Laboratory; Scott C. Hatfield

(57) ABSTRACT

Semiconductor laser architectures that provide weak index guiding of interband cascade lasers (ICLs) processed on a native III-V substrate and of ICLs grown on silicon or integrated on silicon by heterogeneous bonding. Weak index guiding of a ridge waveguide semiconductor laser can enhance the stability of lasing in the fundamental lateral mode, so as to allow a wider ridge to maintain stable single-lateral-mode operation.

21 Claims, 19 Drawing Sheets

(56) References Cited

U.S. PATENT DOCUMENTS

| | | | | | |
|---|---|---|---|---|---|
| 9,612,398 | B2 | 4/2017 | Vurgaftman et al. | | |
| 9,923,338 | B2 | 3/2018 | Meyer et al. | | |
| 10,062,794 | B2 | 8/2018 | Meyer et al. | | |
| 10,297,699 | B2 | 5/2019 | Meyer et al. | | |
| 10,333,011 | B2 | 6/2019 | Meyer et al. | | |
| 10,446,701 | B2 | 10/2019 | Meyer et al. | | |
| 10,453,977 | B2 | 10/2019 | Meyer et al. | | |
| 10,461,202 | B2 | 10/2019 | Meyer et al. | | |
| 10,559,704 | B2 | 2/2020 | Meyer et al. | | |
| 11,125,689 | B2 | 9/2021 | Meyer et al. | | |
| 2006/0153262 | A1* | 7/2006 | Barbieri | B82Y 20/00 | 372/43.01 |
| 2007/0008999 | A1* | 1/2007 | Breznay | B82Y 20/00 | 372/45.01 |
| 2010/0097690 | A1 | 4/2010 | Vurgaftman et al. | | |
| 2015/0318669 | A1* | 11/2015 | Koeth | H01S 5/065 | 372/45.01 |
| 2016/0049770 | A1 | 2/2016 | Frez et al. | | |
| 2016/0359298 | A1 | 12/2016 | Meyer et al. | | |
| 2017/0214214 | A1* | 7/2017 | Yang | H01S 5/04253 | |
| 2017/0373472 | A1 | 12/2017 | Meyer et al. | | |
| 2020/0018701 | A1* | 1/2020 | Meyer | G01J 3/0259 | |
| 2021/0389241 | A1 | 12/2021 | Meyer et al. | | |
| 2021/0389242 | A1 | 12/2021 | Meyer et al. | | |
| 2021/0396664 | A1 | 12/2021 | Meyer et al. | | |
| 2021/0396665 | A1 | 12/2021 | Meyer et al. | | |
| 2021/0396666 | A1 | 12/2021 | Meyer et al. | | |
| 2021/0396667 | A1 | 12/2021 | Meyer et al. | | |
| 2021/0396668 | A1 | 12/2021 | Meyer et al. | | |
| 2021/0396669 | A1 | 12/2021 | Meyer et al. | | |
| 2021/0396670 | A1 | 12/2021 | Meyer et al. | | |
| 2021/0404957 | A1 | 12/2021 | Meyer et al. | | |

OTHER PUBLICATIONS

Vurgaftman et al., J. Phys. D 48, 123001 (2015), "Interband Cascade Lasers".

G. P. Agrawal, J. Lightwave Tech. LT 2, 537 (1984), "Lateral Analysis of Quasi Index Guided Injection Lasers: Transition from Gain to Index Guiding".

Yu et al., Opt. Expr. 15, 13227 (2007), "Near Field Imaging of Quantum Cascade Laser Transverse Modes".

Kaminow et al., Electron. Lett. 17, 318 (1981), "Performance of an Improved InGaAsP Ridge Waveguide Laser at 1.3 μm".

Peters and Cassidy, J. Opt. Soc. Am. B 8, 99 (1991), "Model of the Spectral Output of Gain Guided and Index Guided Semiconductor Diode Lasers".

Forouhar et al., Appl. Phys. Lett. 105, 051110 (2014), "Reliable Mid Infrared Laterally Coupled Distributed Feedback Interband Cascade Lasers".

Gmachl et al., Appl. Phys. Lett. 72, 1430 (1998), "Continuous Wave and High Power Pulsed Operation of Index Coupled Distributed Feedback Quantum Cascade Laser at 8.5 μm".

Semtsiv et al., IEEE J. Quant. Electron. 42, 490 (2006), "Proton Implanted Shallow Ridge Quantum Cascade Laser".

Merritt et al., Proc. SPIE 11288, 112881N (2020), "Effects of Ion Bombardment on Interband Cascade Laser Structures".

Kim et al., Appl. Phys. Lett. 101, 061104 (2012), "Mid-infrared distributed-feedback interband cascade lasers with continuous-wave single-mode emission to 80 ° C.".

Von Edlinger, IEEE Phot. Tech. Lett. 26, 480 (2014), "Monomode Interband Cascade Lasers at 5.2 μm for Nitric Oxide Sensing".

Colombelli et al., Science 302, 1374 (2003), "Quantum Cascade Surface Emitting Photonic Crystal Laser".

Vurgaftman et al., Nature Commun. 2, 585 (2011), "Rebalancing of Internally Generated Carriers for Mid IR Interband Cascade Lasers with Very Low Power Consumption".

Theodoros et al., Proc. Nat. Acad. Sci. 111, 2879 (2014), "High Coherence Semiconductor Lasers Based on Integral High Q Resonators in Hybrid Si/III V Platforms".

Komljenovic et al., J. Lightwave Tech. 34, 20 (2016), "Heterogeneous Silicon Photonic Integrated Circuits".

Spott et al., Optica 5, 996 (2018), "Interband Cascade Laser on Silicon".

Meyer et al., Sensors 21, 599 (2021), "Interband Cascade Photonic Integrated Circuits on Native III V Chip".

Stanton et al., Photonics 6, 6 (2019), "Multi Spectral Quantum Cascade Lasers on Silicon with Integrated Multiplexers".

Cerutti et al., Optica 8, 1397 (2021), "Quantum well interband semiconductor lasers highly tolerant to dislocations".

Kim, IEEE Phot. Tech. Lett. 16, 15 (2004), "Design and Analysis of Widely Tunable Sampled Grating DFB Laser Diode Integrated With Sampled Grating Distributed Bragg Reflector".

Herbert et al., IET Optoelectron. 3, 1 (2009), "Discrete mode lasers for communication applications".

Lotfi et al., Appl. Phys. Lett. 109, 151111 (2016), "Monolithically integrated mid IR interband cascade laser and photodetector operating at room temperature".

Rogalski et al., Prog. Quant. Electron. 68, 100228 (2019), "Type II superlattice photodetectors versus HgCdTe photodiodes".

A. Rogalski et al., Appl. Phys. Rev. 4, 031304 (2017), "InAs/GaSb type II superlattice infrared detectors: Future prospect".

Almeida et al., Opt. Lett. 29, 1209 (2004), "Guiding and confining light in void nanostructure".

Zhou et al., J. Appl. Phys. 123, 063103 (2018), "Fully suspended slot waveguide platform".

Wangüemert Pérez et al., Opt. Lett. 39, 4442-4445 (2014), "Evanescent field waveguide sensing with subwavelength grating structures in silicon on insulator".

Hogan et al., Opt. Expr. 27, 3169 (2019), "Mid infrared optical sensing using sub wavelength gratings".

Khonina et al., IEEE Sensors 20, 8469 (2020), "Evanescent Field Ratio Enhancement of a Modified Ridge Waveguide Structure for Methane Gas Sensing Application".

Rostamian et al., Conference on Lasers and Electro Optics, Technical Digest (2020), "Sub Parts Per Million Level Detection of Ethanol using Mid Infrared Photonic Crystal Waveguide in Silicon on Insulator".

Sanchez Postigo et al., Opt. Expr. 29, 16867 (2021), "Suspended germanium waveguides with subwavelength grating metamaterial cladding for the mid infrared band".

Affentauschegg and Wieder, Semicond. Sci. Technol. 16, 708 (2001) "Properties of InAs/InAlAs heterostructures".

Chen et al., Appl. Phys. Lett. 99, 183503 (2011), "Elimination of Surface Leakage in Gate Controlled Type II InAs/GaSb Mid Infrared Photodetectors".

Macomber et al., Appl. Phys. Lett. 51, 472 (1987), "Surface Emitting Distributed Feedback Semiconductor Laser".

Evans and Hammer, editors, Surface Emitting Semiconductor Lasers and Arrays, Chapter 4 (Academic Press, Boston, 1993).

Lyakh et al., Appl. Phys. Lett. 91, 181116 (2007), "Substrate Emitting, Distributed Feedback Quantum Cascade Lasers".

Canedy et al., Optics Express 27, 3771 (2019), "Resonant Cavity Infrared Detector with Five Quantum Well Absorber and 34% External Quantum Efficiency at 4 μm".

Iga, IEEE J. Sel. Topics Quant. Electron 6, 1201 (2000), "Surface Emitting Laser-Its Birth and Generation of New Optoelectronics Field".

Noda et al., IEEE J. Sel. Topics Quant. Electron. 23, 4900107 (2017), "Photonic Crystal Surface Emitting Lasers: Review and Introduction of Modulated Photonic Crystals".

Takeda, Opt. Expr. 22, 702 (2015), "Heterogeneously Integrated Photonic Crystal Lasers on Silicon for On/Off Chip Optical Interconnects".

Zhou et al., Nat. Commun. 11, 977 (2020), "Continuous Wave Quantum Dot Photonic Crystal Lasers Grown on on Axis Si (001)".

Tian et al., Electron. Lett. 45, 48 (2009), InAs Based Interband Cascade Lasers Near 6 μm.

Li et al., J. Cryst. Growth 425, 369 (2015), "MBE Grown Long Wavelength Interband Cascade Lasers on InAs Substrates".

Dallner et al., Appl. Phys. Lett. 106, 041108 (2015), "InAs-based interband-cascade-lasers emitting around 7 μm with threshold current densities below 1 kA/cm2 at room temperature".

(56) References Cited

OTHER PUBLICATIONS

Dallner, Appl. Phys. Lett. 107, 181105 (2015), "InAs-based distributed feedback interband cascade lasers".

Canedy et al., Proc. SPIE 10111, 10111 0G (2017), "Interband Cascade Lasers with Longer Wavelengths".

Soref et al., J. Opt. A 8, 840 (2006), "Silicon waveguided components for the long wave infrared region".

Search Report and Written Opinion mailed Jul. 11, 2023 in corresponding International Application PCT/US2023/060071.

Kim, M., et al., "High-power continuous-wave interband cascade lasers with 10 active stages," Optics Express, vol. 23, Issue 8, pp. 9664-9672, Apr. 6, 2015.

* cited by examiner

100

107
106
105
104
103
102
101

*n*+ InAs Contact

*n* InAs-AlSb SL Top Clad

Top *n* GaSb SCL

Active ICL Stages

Bottom *n* GaSb SCL

*n* InAs-AlSb SL Bottom Clad

*n*+ GaSb Substrate

Meyer *et al.*, *Photonics* 7, 75 (2020), "The Interband Cascade Laser"

400

InAsSb contact
InAs/AlSb clad
GaSb SCH
ICL stages
GaSb SCH
InAs/AlSb clad
SiN clad
Si
SiO$_2$
Si substrate Spott *et al.*, *Optica* 5, 996 (2018), "Interband Cascade Laser on Silicon."

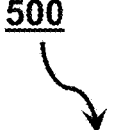
111a                    112                    111b
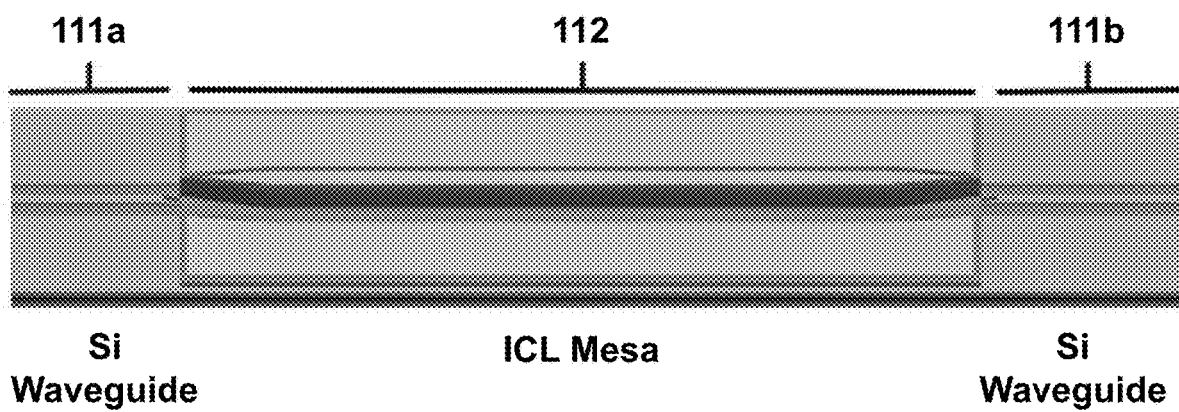
Si                        ICL Mesa                        Si
Waveguide                                              Waveguide
Spott *et al.*, *Optica* 5, 996 (2018), "Interband Cascade Laser on Silicon."
*FIG. 5*
*(Prior Art)*

800

113

110

109 e-Au

Top Metal Contact $n^+$ InAs Contact $n$ InAs-AlSb (Top Clad)

Active ICL Stages $n$ GaSb SCL $n$ InAs-AlSb (Bottom Clad)

$n^+$ GaSb Substrate

Bottom Metal Contact

<u>1400</u>
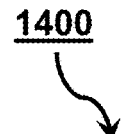
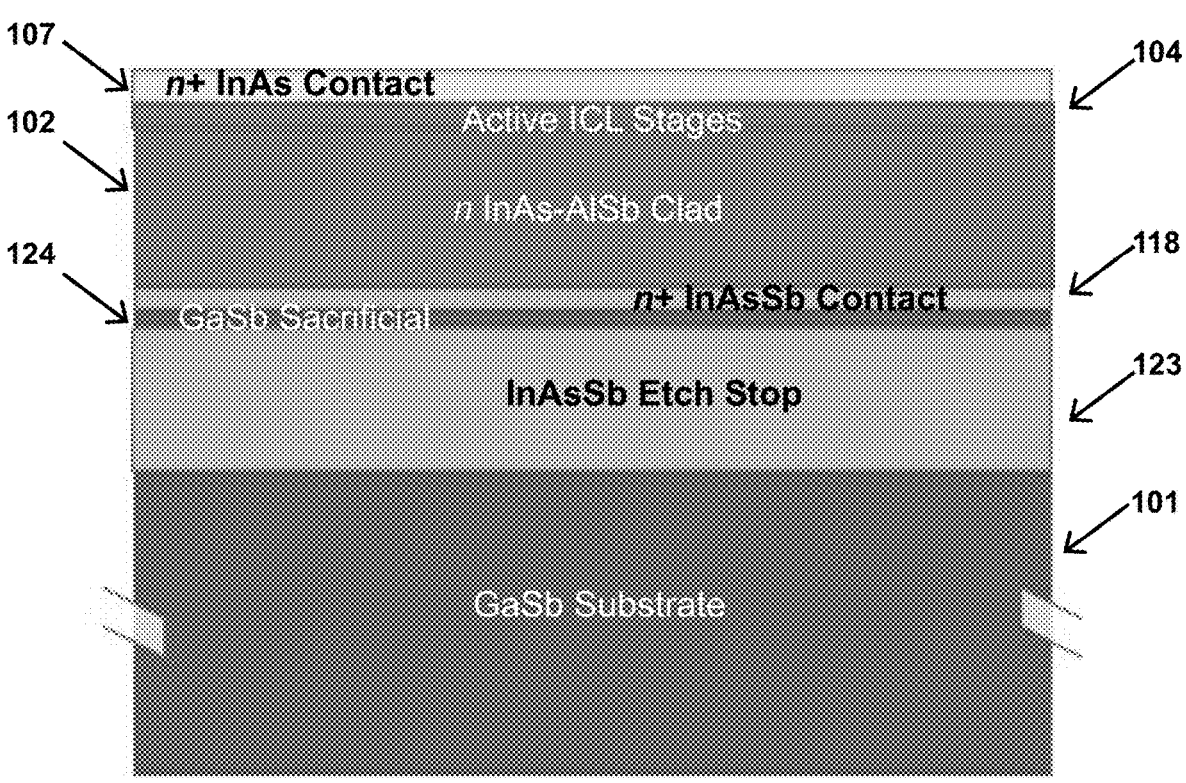
107 — *n*+ InAs Contact
102 — 
124 — 
104 — Active ICL Stages
118 — *n* InAs-AlSb Clad / *n*+ InAsSb Contact
123 — GaSb Sacrificial / InAsSb Etch Stop
101 — GaSb Substrate
*FIG. 14*

1302

1301

1601

121 Ge SCL

110 Top Contact

1602

Etched Gain Waveguide

Etched waveguide which has elements shown in FIG. 14

125

119 Bottom Contact

121 Ge SCL

Silicon-Based Substrate with DFB and Ge layer

122

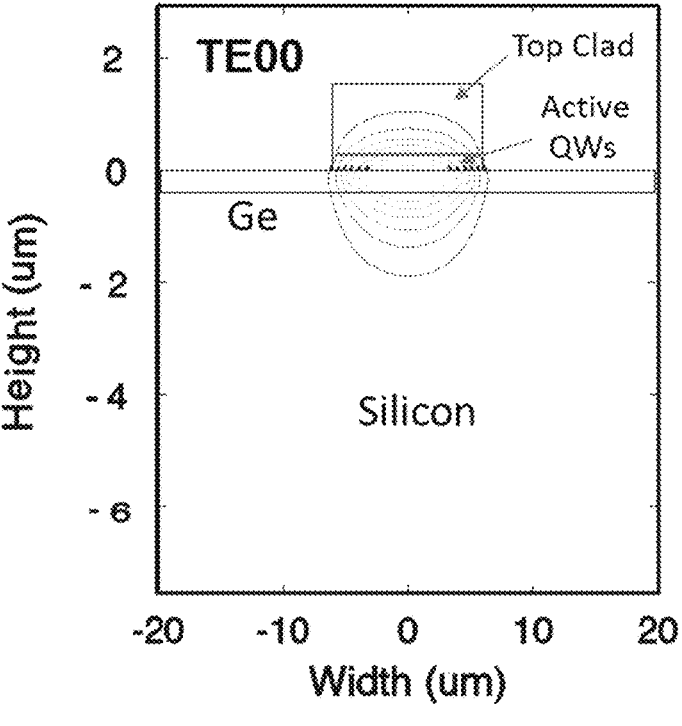
*FIG. 17A*
*FIG. 17B*
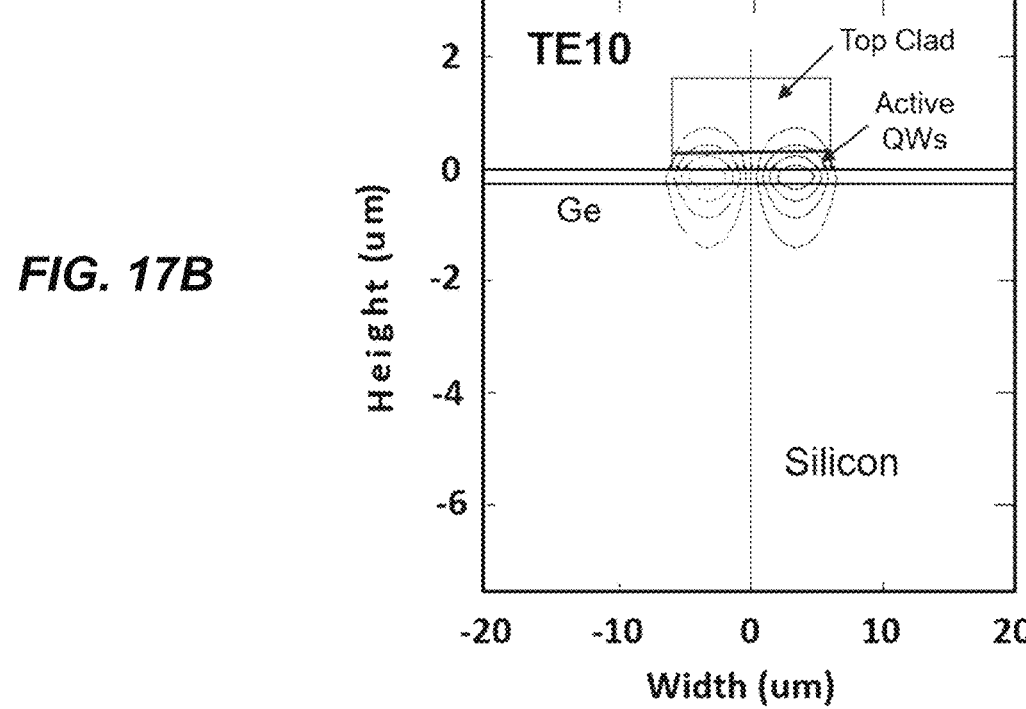

WEAK INDEX GUIDING OF INTERBAND CASCADE LASERS

CROSS-REFERENCE

This Application is a Nonprovisional of and claims the benefit of priority under 35 U.S.C. § 119 based on U.S. Provisional Patent Application No. 63/296,176 filed on Jan. 4, 2022. The Provisional Application and all references cited herein are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, DC 20375, USA; +1.202.767.7230; techtran@nrl.navy.mil, referencing Navy Case #210925.

TECHNICAL FIELD

The present disclosure relates to semiconductor laser architectures, particularly to laser architectures that provide weak index guiding of interband cascade lasers (ICLs) processed on a native III-V substrate and to ICLs grown on silicon or integrated on silicon by heterogeneous bonding or other means.

BACKGROUND

ICLs are semiconductor lasers that produce gain in a staircase of active stages which are stacked for electrical injection in series. ICLs employ interband optical transitions between the conduction and valence bands to produce gain [Meyer et al., *Photonics* 7, 75 (2020), "The Interband Cascade Laser"]. ICLs operate primarily in the midwave infrared (MWIR, defined here as wavelengths λ extending roughly from 2.5 to 7 μm). It is well known that specific designs of the active ICL stages, which are usually grown lattice matched to a GaSb or InAs substrate, or grown metamorphically on silicon, can have many variants [Meyer 2020, supra]. In describing the present invention, "active ICL stages" refers to any variant that comprises a staircase of stages, each of which contains electron and/or hole injector regions that inject carriers into active type-I or type-II quantum wells, and in which interband optical transitions produce gain when sufficient current flows through the staircase of stages.

The block schematic in FIG. 1 illustrates a typical layering configuration for a conventional ICL from the prior art [Meyer 2020, supra], which is grown by molecular beam epitaxy (MBE) on a GaSb substrate. As illustrated in FIG. 1, such an ICL 100 includes an active ICL stages 104 (typically 5-10 active stages) that is surrounded by lightly-doped n-type bottom and top GaSb separate confinement layers (SCLs) 103 and 105, which are in turn surrounded by bottom and top InAs—AlSb superlattice (SL) optical cladding layers 102 and 106. Not shown in the figure are additional thin transition SLs that are positioned between the various regions to smooth abrupt shifts of the conduction band offset [Meyer 2020, supra]. A GaSb buffer layer (not shown in figures) is first grown on the GaSb substrate 101, and both substrate and buffer are n+-doped to provide low electrical resistance to a contact on the bottom of the substrate. The epitaxial layers are capped by an n+-InAs(Sb) top contacting layer. A large fraction of the optical mode, e.g., 77% [Vurgaftman et al., J Phys. D 48, 123001 (2015), "Interband Cascade Lasers"] resides in the two lightly-n-doped GaSb SCLs, which combine a high refractive index with low optical loss. In most conventional ICL designs from the prior art, the top and bottom SCLs have roughly the same thickness.

In an index-guided semiconductor laser, the waveguide core is surrounded both vertically and laterally by materials with lower refractive index [G. P. Agrawal, *J. Lightwave Tech.* LT-2, 537 (1984), "Lateral Analysis of Quasi-Index-Guided Injection Lasers: Transition from Gain to Index Guiding"]. The core of an ICL comprises the active gain stages 104 along with the top and bottom SCLs 103 and 105. The collective refractive index of this core is higher than that of the top and bottom optical cladding layers 102 and 106, and is also much higher than that of the insulating dielectric 109 that coats the ridge sidewalls. This difference in refractive index guides the light propagation and confines a significant portion of the optical mode to the active ICL stages 104, thereby producing gain.

Most ridge waveguide ICLs from the prior art have employed abrupt (strong) index guiding, which occurs when the deep etch that defines the narrow ridge (typically obtained by reactive ion etching) extends to below the active stages. The block schematic in FIG. 2 illustrates an example 200 of this for the case of an ICL, where the ICL has the same layer structure as shown in FIG. 1 which is deeply etched to form a narrow ridge that extends below the active gain stages. The ICL structure shown in FIG. 2 further includes bottom and top metal contacts 108 and 110, with insulating dielectric layer such as SiN insulating film 109 disposed on the top of the exposed bottom n-type GaSb SCL layer and along the sides of the ridge. The arrows in FIG. 2 indicate the vertical flow of current through the device that produces gain under forward bias. In the conventional ridge waveguide ICL of FIG. 2, most of the optical mode's vertical profile resides within the ridge, since the etch stops below both the top SCL and the active gain stages. With most of the core directly adjacent to the dielectric sidewall coating, the refractive index varies abruptly between high in the core and low in the dielectric.

The most obvious way to scale the output power from a single narrow ridge waveguide laser is to increase the active volume that produces gain. This can be accomplished by lengthening the cavity, which is ultimately limited by a lower external efficiency associated with higher roundtrip propagation loss, or by widening the ridge waveguide. However, the quality of the beam emitted from a conventional ridge waveguide laser with strong (or abrupt) index guiding tends to degrade rapidly when its width substantially exceeds the lasing wavelength, due to the onset of lasing in higher-order lateral modes in addition to the single-lobed fundamental mode [Yu et al., Opt. Expr. 15, 13227 (2007), "Near-Field Imaging of Quantum Cascade Laser Transverse Modes"].

However, it is well known from diode laser technology at shorter wavelengths in the near IR that the "weak index guiding" approach can provide more stable operation in a first-order lateral mode as compared to strong index guiding [Kaminow et al., *Electron. Lett.* 17, 318 (1981), "Performance of an Improved InGaAsP Ridge Waveguide Laser at 1.3 μm"; Peters and Cassidy, *J. Opt. Soc. Am. B* 8, 99 (1991), "Model of the Spectral Output of Gain-Guided and Index-Guided Semiconductor Diode Lasers"]. The block schematic in FIG. 3 illustrates an ICL structure 300 that induces weak index guiding by etching an inner ridge to a depth stopping above the active gain stages. The structure illustrated in FIG. 3 includes the same basic layer structure as described above with respect to FIGS. 1 and 2, but has both a narrow inner laser ridge defined by a shallow etch that stops within the top GaSb SCL and above the active gain stages, and a wider outer ridge defined by a deep etch that stops below the active region.

The index guiding is much weaker in this case because most of the waveguide core now resides below the etch that defines the inner laser ridge, so it is no longer adjacent to the low-index dielectric. Due to the intermediate step in the modal refractive index, the fundamental lasing mode is then more confined by the larger refractive index at the center of the inner laser ridge than are the higher-order modes. This provides greater differentiation of the lasing thresholds for fundamental vs. higher-order modes. It therefore allows a much wider inner laser ridge to operate stably in the fundamental mode. The defining distinction is that when the optical modes with the highest gain in the laser waveguide are weakly-index-guided, a much smaller fraction of the vertical optical mode profile lies above the etch depth of the inner laser ridge than in the case of an abruptly-index-guided ridge waveguide. The mode fraction residing in the inner laser ridge must be small enough that lasing in higher-order lateral modes remains insignificant at inner ridge widths much wider than can maintain lasing primarily in the fundamental mode when the index guiding is strong (abrupt). However, how small the mode fraction must be to have the desired effect on mode discrimination depends quantitatively on details of the gain, loss, and refractive index profiles of the various layers in the device structure.

When applied to conventional diode lasers with GaAs- or InP-based quantum wells emitting in the near IR, the double ridge geometry has little adverse impact on the current injection efficiency. Because the electrical conductivity in those structures is nearly isotropic, very little current spreads laterally into the outer ridge where it would not contribute additional gain or generate photons. However, as seen by the arrows showing the lateral flow of current into the outer ridge of such a device, ICLs experience considerable lateral current spreading due to their highly anisotropic electrical conductivity, which is much greater laterally than vertically due to the short-period multiple quantum wells that comprise the active stages [Forouhar et al., *Appl. Phys. Lett.* 105, 051110 (2014), "Reliable Mid-Infrared Laterally-Coupled Distributed-Feedback Interband Cascade Lasers"; Gmachl et al., *Appl. Phys. Lett.* 72, 1430 (1998), "Continuous-Wave and High-Power Pulsed Operation of Index-Coupled Distributed Feedback Quantum Cascade Laser at 8.5 µm"]. Hence a weakly-index-guided double-ridge ICL such as that illustrated in FIG. 3 would suffer from substantial parasitic current injection into the outer ridge (indicated by the red arrows), where it produces heat without generating photons. The consequence of this is a substantial reduction of the wallplug efficiency (WPE), along with a hotter core that further degrades the efficiency. Although in some semiconductor lasers lateral current spreading can be suppressed by ion bombardment [Semtsiv et al., *IEEE J. Quant. Electron.* 42, 490 (2006), "Proton-Implanted Shallow-Ridge Quantum-Cascade Laser"], to date this approach has been unreliable when applied to ICLs [Merritt et al., *Proc. SPIE* 11288, 112881N (2020), "Effects of Ion Bombardment on Interband Cascade Laser Structures"]. Therefore it is not surprising that no weakly-index-guided ICLs have been reported to date.

The conventional procedure for processing individual ICLs that operate in continuous wave (cw) mode is to define the narrow ridge by reactive ion etching, followed by coating the ridge sidewalls with a dielectric such as SiN or SiO$_2$ to prevent shorting of the active stages. A top metal contact is deposited, and gold electro-plating is applied to the top of the structure to maximize heat extraction. The lasers are next cleaved to a desired cavity length, one facet is coated with a dielectric and metal (or a dielectric Bragg mirror) for high reflection (HR), and the other is either left uncoated (U) or coated with one or more dielectric layers for anti-reflection (AR). The device is finally singulated and soldered to a heat sink upside down (epitaxial-side-down, or epi-down, also referred to as flip-chip bonding). Those steps are costly, and sometimes do not provide high laser performance with high yield.

ICLs can be induced to emit in a single spectral mode by patterning the structure with a distributed feedback (DFB) grating that periodically modulates the modal refractive index. For some semiconductor lasers, the grating can be etched into a top layer with relatively high refractive index above the active quantum wells, followed by the overgrowth of a top optical cladding layer that provides a contrasting refractive index and is sufficiently thick to prevent mode penetration to the top contact metallization. However, since at present no suitable overgrowth technology exists for ICLs grown on GaSb or InAs substrates, the DFB grating must be etched into the top surface of an epitaxial structure with reduced thickness of the top optical cladding layer, so as to allow penetration of the optical mode into the grating [Kim et al., *Appl. Phys. Lett.* 101, 061104 (2012)]. The top of the grating must then be metallized to provide the top electrical contact. This substantially degrades the laser efficiency, because without an overgrown top clad layer the lasing mode inevitably penetrates to the metal contact, inducing optical loss that increases exponentially with inverse clad thickness. The result is a trade between weak coupling to the DFB grating with a relatively thick top clad layer, or high loss with a relatively thin top clad layer. An alternative DFB geometry for ICLs is to displace the grating to the side of the active gain stages rather than on top [Forouhar, supra; von Edlinger, *IEEE Phot. Tech. Lett.* 26, 480 (2014), "Mono-mode Interband Cascade Lasers at 5.2 µm for Nitric Oxide Sensing"]. In this geometry, the ridge must be narrow enough to provide sufficient evanescent overlap of the fundamental optical mode with the grating.

Moreover, the yield of laser fabrication can be limited by the quality of the grating etched into a III-V material, especially in the case of ICLs for which GaSb-based processing is both less mature and intrinsically more challenging. These issues are exacerbated further when a strong grating is required, e.g., for a $2^{nd}$-order DFB grating that provides surface emission [Colombelli et al., *Science* 302, 1374 (2003), "Quantum Cascade Surface-Emitting Photonic Crystal Laser"]. The same considerations are even more limiting in the case of complex 2D photonic crystal gratings designed for surface emission from a larger area. For these reasons, an architecture that provides strong coupling to a DFB or photonic crystal grating without limiting the ridge width, and which can be fabricated with a mature processing technology such as that available for silicon, will be advantageous.

For some MWIR and longwave infrared (LWIR) applications that do not require high output power from the laser, minimizing the drive power and system footprint can be key performance metrics. For example, it may be important to maximize the battery lifetime of a chemical sensing or monitoring system that is hand-held or permanently installed under conditions where frequent maintenance is inconvenient. Some fielded systems may even operate using solar power. The threshold drive power for an ICL is the product $V_{th} \times I_{th}$, where $V_{th}$ and $I_{th}$ are the voltage and current thresholds, and the latter is nominally proportional to the cavity length. When both ends of the laser must be cleaved, conventional methods can provide a minimum practical cavity length of order ≈0.5 mm, which is also roughly the minimum length for which a conventional ICL can operate before the mirror loss in an HR/U (meaning an HR coating is deposited on one end facet while the other is left uncoated) or HR/AR (an HR coating is deposited on one end facet and AR coating is deposited on the other) cavity becomes excessive. The lowest drive power ever reported to date for an ICL operating in cw mode at room temperature is 29 mW for an ICL [Vurgaftman et al., Nature Commun. 2, 585 (2011), "Rebalancing of Internally Generated Carriers for Mid-IR Interband Cascade Lasers with Very Low Power Consumption"]. Some applications would benefit substantially from a reduction of this value.

Near IR III-V lasers and other active components such as detectors and modulators have been integrated on silicon by heterogeneously bonding an unprocessed III-V wafer material to a pre-processed silicon substrate, etching away the III-V substrate, and then processing the active III-V devices from the back [Theodoros et al., Proc. Nat. Acad. Sci. 111, 2879 (2014), "High-Coherence Semiconductor Lasers Based on Integral High-Q Resonators in Hybrid Si/III-V Platforms"; Komljenovic et al., J. Lightwave Tech. 34, 20 (2016), "Heterogeneous Silicon Photonic Integrated Circuits"]. Complex photonic integrated circuits (PICs) operating in the near IR have demonstrated high performance, and may be considered relatively mature. The silicon-based chip is typically a silicon-on-insulator (SOI) wafer, which comprises a silicon substrate with $SiO_2$ and silicon layers on top. Passive waveguides may be formed by pre-patterning ridges with the top Si layer serving as the core and the underlying $SiO_2$ as the bottom clad. An integrated laser can be fabricated by processing the heterogeneously-bonded near-IR gain material into a hybrid III-V/Si/$SiO_2$ waveguide whose optical mode may be shared between an upper III-V ridge and an underlying pre-patterned silicon ridge. The $SiO_2$ below the top silicon layer again forms the bottom clad. Although the low thermal conductivity of $SiO_2$ presents a thermal barrier to heat dissipation via the silicon substrate when it is bonded to a heat sink, this additional thermal resistance is generally acceptable in low-power near-IR diode lasers since the heat generated during operation in continuous-wave (cw) mode (e.g., for telecommunications) is relatively modest.

ICLs emitting in the MWIR have similarly been integrated on silicon by heterogeneously bonding an unprocessed GaSb-based III-V gain chip to a pre-patterned silicon-based (SOI) substrate [Spott et al., Optica 5, 996 (2018), "Interband Cascade Laser on Silicon."]. It is envisioned that integrated ICLs will ultimately provide key source components for mid-IR PICs designed for applications such as on-chip chemical sensing, as well as for more complex configurations such as on-chip dual-comb spectroscopy [Meyer et al., Sensors 21, 599 (2021), "Interband Cascade Photonic Integrated Circuits on Native III-V Chip"]. Once the technology is mature, mid-IR PICs will provide powerful functionality by combining sources, detectors, modulators, passive waveguides, and passive optical elements such as arrayed waveguide gratings (AWGs) [Stanton et al., Photonics 6, 6 (2019), "Multi-Spectral Quantum Cascade Lasers on Silicon with Integrated Multiplexers"] for spectral beam multiplexing and demultiplexing on a single chip. However, due to the higher multiplicity of active gain quantum wells required to overcome a larger internal loss in the MWIR, ICLs typically require a higher drive power than near-infrared diode lasers to operate. Because heat dissipation is limited by the thermal bottleneck imposed by a SOI substrate, there have been no published reports to date of an ICL integrated on silicon operating in cw mode.

A particular advantage of the heterogeneous-bonding integration approach is that strong DFB gratings can be etched into the top of the SOI, silicon-on-nitride-on-insulator (SONOI), or other silicon-based substrate using mature silicon processing protocols before the III-V chip is bonded. The bonding process allows a high resolution grating to be introduced close to the laser active core and with high optical mode overlap, but still far from metal and without epitaxial regrowth. As discussed above, it is much more difficult to fabricate a high-quality DFB laser on the native III-V substrate, i.e., a substrate that is lattice-matched to the active epitaxial layers, such as a substrate on which the active epitaxial layers were grown using conventional protocols, which are especially less mature and intrinsically more challenging in the case of GaSb-based processing of ICLs.

The block schematic in FIG. 4 is a cross-sectional end view 400 of an ICL integrated on SOI in accordance with the prior art. See Spott et al., 2018, supra. The schematic in FIG. 4 illustrates that the active gain section of a typical integrated ICL from the prior art comprises a hybrid III-V/Si waveguide, in which the III-V gain material and pre-patterned underlying silicon ridge share the optical mode, although most of the mode falls in the higher III-V portion.

FIG. 5 is a block schematic illustrating a conventional hybrid waveguide 500 designed to couple light from a hybrid active waveguide in an ICL mesa 112 to passive silicon waveguides 111a/111b on each end. As illustrated in FIG. 5, such hybrid waveguides typically are tapered at each end of the gain section to facilitate transfer of the optical mode. In the case of integrated near-IR lasers, such a taper generally provides efficient optical coupling to a passive silicon waveguide [Komljenovic, supra], which may connect to other optical or electronic components on the PIC or output light from the chip at a facet created by cleaving or other means. However, characterization of such integrated ICLs has shown that the tapers demonstrated to date coupled only a small fraction of the propagating light into the passive silicon waveguide. On the other hand, after one taper was polished away to allow output from the hybrid waveguide, the slope efficiency for the integrated ICL was much higher. In fact, at present the poor coupling efficiency between the active hybrid and passive silicon waveguides represents the biggest hurdle to the development of high-performance mid-IR PICs. A primary challenge in achieving efficient coupling results from the minimal spatial overlap between the optical modes propagating in the two waveguide sections. Note from FIG. 4 that the hybrid mode concentrated mostly in the III-V material must be transferred to the much lower silicon waveguide.

Another limitation of the ICLs integrated on silicon developed to date has been severe current leakage at the sidewalls of the ridge waveguides [Spott 2018, supra]. Mitigation of this sidewall leakage would substantially improve the threshold and efficiency of integrated ICLs.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention describes novel semiconductor laser architectures that provide weak index guiding of at least one predetermined optical mode of an interband cascade laser (ICLs) processed on the native III-V substrate, and also ICLs grown on silicon or integrated on silicon by heterogeneous bonding. Weak index guiding of a ridge waveguide semiconductor laser can enhance the stability of lasing in the fundamental lateral mode while suppressing higher-order modes, so as to allow a wider ridge to maintain stable single-lateral-mode operation at higher output powers.

The present invention will also provide efficient heat dissipation for ICLs mounted on silicon without requiring epitaxial-side-down mounting or flip-chip bonding. It is anticipated that this may lead to higher wallplug efficiency than devices from the prior art can produce. The invention will also provide enhanced coupling of an ICL integrated on silicon to a one-dimensional (1D) distributed feedback (DFB) grating, 1D discrete mode (DM) grating, or two-dimensional (2D) photonic crystal grating.

The present invention will also provide high-efficiency surface emission from an ICL integrated on silicon, which may optionally be obtained without requiring any cleaved or etched facet to define either end of the laser cavity.

The present invention will also provide ICLs integrated on silicon that operate with lower drive power than any devices demonstrated to date based on the prior art.

The present invention will also provide improved coupling from a hybrid III-V/Si waveguide, which incorporates active ICL stages to provide gain when operated under forward bias or photocurrent for detection when operated near zero bias, to a passive silicon-based waveguide residing on the same chip.

The present invention will also provide reduced current leakage at the sidewalls of an ICL processed on its native GaSb substrate or integrated on silicon.

The present invention will also provide more robust and efficient normal-incidence input coupling of a collimated external optical beam to an on-chip passive waveguide than is possible by conventional edge-coupling of the beam to the waveguide.

The present invention also teaches device architectures that may be used to manufacture ICLs in high volume and at lower cost than any current technology.

BRIEF DESCRIPTION OF THE DRAWINGS

FIG. 5 is a block schematic illustrating a top view of the tapers designed to couple light from a hybrid active waveguide to passive waveguides in an integrated ICL in accordance with the prior art.

FIG. 13A illustrates the silicon-based substrate shown in FIG. 11 following deposition or transfer of a thin Ge layer which is then pre-patterned for tapering of the hybrid waveguide to a narrower Ge/Si waveguide and FIG. 13B illustrates a III-V epitaxial gain structure before it is bonded to the silicon-based substrate, in accordance with one or more aspects of the present invention.

FIG. 14 is a block schematic illustrating a cross-sectional end view of an exemplary active ICL gain die that is cleaved from a wafer grown by MBE on GaSb.

FIG. 16A illustrates a 3D view for aspects of an integrated ICL having a hybrid III-V/Ge/Si gain waveguide and FIG. 16B illustrates the cross-sectional end view for aspects of the same processed ICL integrated on a silicon-based substrate.

FIGS. 17A and 17B are plots illustrating the fundamental (FIG. 17A) and second-order (FIG. 17B) lateral optical modes in an exemplary weakly-index-guided ICL having the structure shown in FIG. 16B and a ridge width of 12 μm.

DETAILED DESCRIPTION

Figure 1:
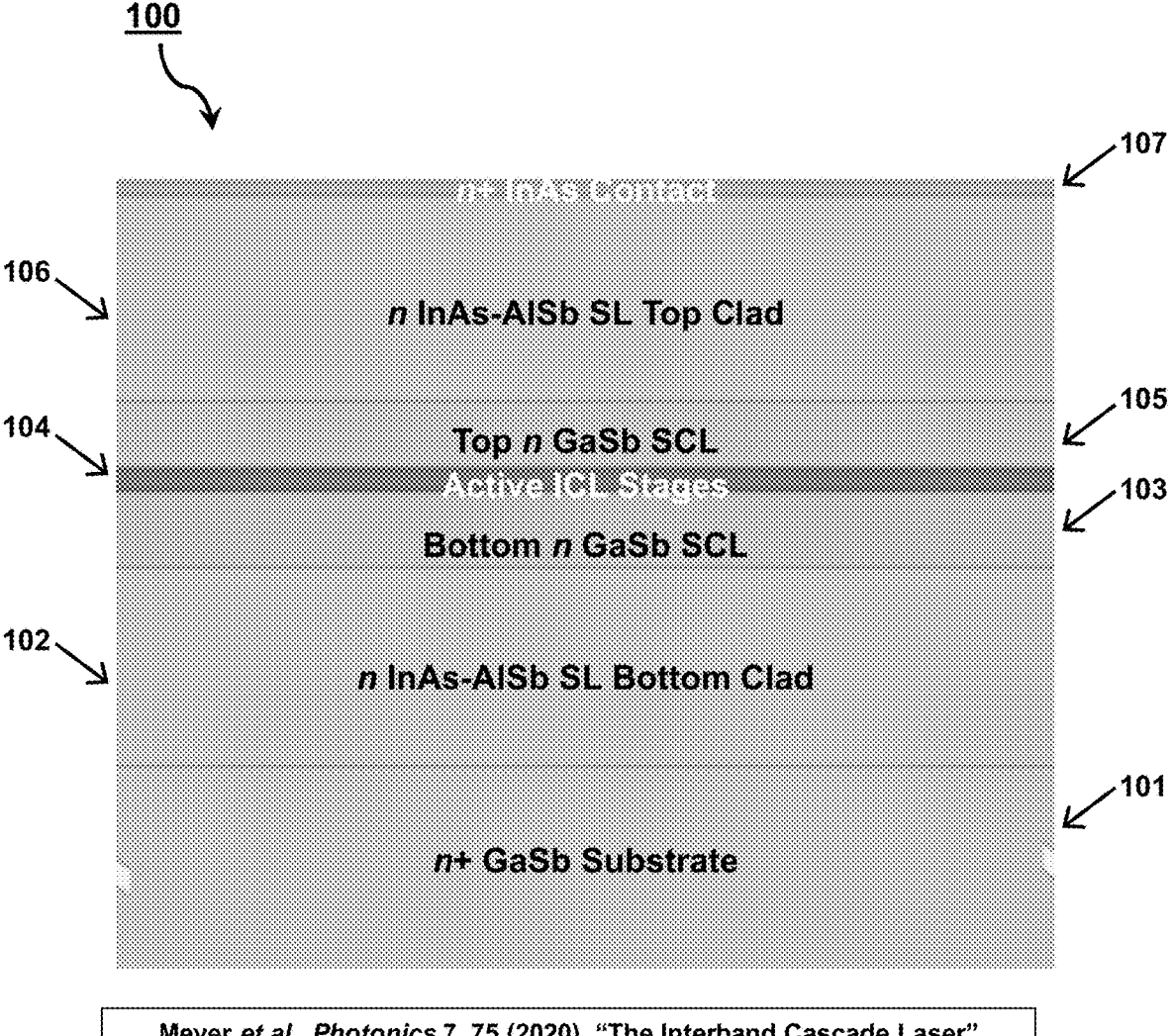
FIG. 1 is a block schematic illustrating the basic material layer structure of an exemplary interband cascade laser (ICL) in accordance with the prior art.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention describes novel semiconductor laser architectures that provide weak index guiding of at least one predetermined optical mode in interband cascade lasers (ICLs) processed on the native III-V substrate, and also ICLs grown on silicon or integrated on silicon by heterogeneous bonding. Weak index guiding of a ridge waveguide semiconductor laser can enhance the stability of lasing in the fundamental lateral mode, so as to allow a wider ridge to maintain stable single-lateral-mode operation.

The present invention will also provide efficient heat dissipation for ICLs mounted on silicon without requiring epitaxial-side-down mounting or flip-chip bonding. It is anticipated that this may lead to higher wallplug efficiency than devices from the prior art can produce. The invention will also provide enhanced coupling of an ICL integrated on silicon to a one-dimensional (1D) distributed feedback (DFB) grating, 1D discrete mode (DM) grating, or two-dimensional (2D) photonic crystal grating.

The present invention will also provide high-efficiency surface emission from an ICL integrated on silicon, which may optionally be obtained without requiring any cleaved or etched facet to define either end of the laser cavity.

The present invention will also provide ICLs integrated on silicon that operate with lower drive power than any devices demonstrated to date based on the prior art.

The present invention will also provide improved coupling from a hybrid III-V/Si waveguide, which incorporates active ICL stages to provide gain when operated under forward bias or photocurrent for detection when operated near zero bias, to a passive silicon-based waveguide residing on the same chip.

The present invention will also provide reduced current leakage at the sidewalls of an ICL processed on its native GaSb substrate or integrated on silicon.

The present invention will also provide more robust and efficient normal-incidence input coupling of a collimated external optical beam to an on-chip passive waveguide than is possible by conventional edge-coupling of the beam to the waveguide.

The present invention also teaches device architectures that may be used to manufacture ICLs in high volume and at lower cost than any current technology.

These and other aspects and embodiments of weakly-index-guided ICLs in accordance with the present invention will now be described with reference to the FIGURES, which are incorporated by reference into and form a part of the present disclosure.

For the sake of brevity, where elements in a FIGURE have previously been described, detailed description of those elements will not be repeated, and only elements newly presented in a FIGURE will be described in detail. For ease of reference, the elements of the structures illustrated by the FIGURES and denoted by reference numbers are listed in the table below:

| FIGURE Element | Reference Number |
| --- | --- |
| n+ GaSb Substrate | 101 |
| n InAs-AlSb superlattice (SL) Bottom Clad | 102 |
| Bottom n-type GaSb Separate Confinement Layer (SCL) | 103 |
| Active ICL Stages | 104 |
| Top n-type GaSb SCL | 105 |
| n InAs-AlSb SL Top Cladding Layer | 106 |
| n+ InAs(Sb) Contact Layer | 107 |
| Contact Metal Layer on Bottom of an n+ GaSb substrate | 108 |
| SiN Insulating Film | 109 |
| Top Contact Metal | 110 |
| Si Waveguide | 111a/b |
| ICL Mesa | 112 |
| Electro-Plated Au | 113 |
| Heat Sink | 114 |
| Solder | 115 |
| Silicon Substrate | 116 |
| n– GaSb Buffer Layer | 117 |
| n+ InAsSb Contact Layer | 118 |
| Bottom Metal Contact | 119 |
| DFB Grating | 120 |
| Ge Layer | 121 |
| Silicon-Based Substrate with Ge Layer | 122 |
| InAsSb Etch Stop Layer | 123 |
| GaSb Sacrificial Layer | 124 |
| Etched ICL gain Waveguide | 125 |
| SiO$_2$ Layer | 126 |
| Si Portion of Hybrid Waveguide | 127 |

As described in more detail below, in accordance with the present invention, various embodiments of structures having one or more of these elements can provide weak index guiding of at least one predetermined optical mode in an interband cascade laser (ICL).

A. Weakly-Index-Guided ICLs Processed on a Native GaSb Substrate

Figure 6:
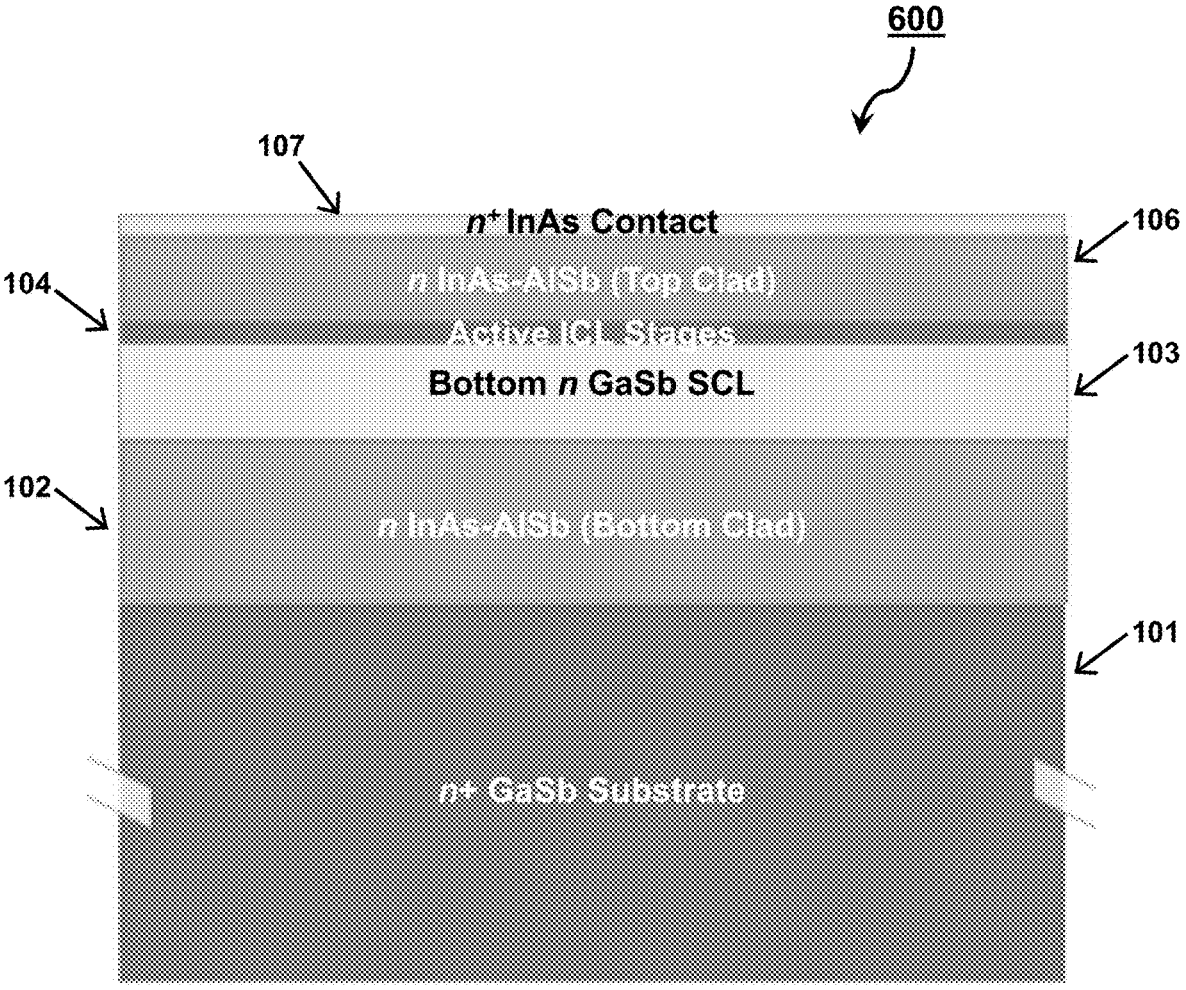
FIG. 6 is a block schematic illustrating an exemplary material layer structure for an ICL that provides weak index guiding in accordance with one or more aspects of the present invention.

The present invention provides weak index guiding of at least one predetermined optical mode in an ICL processed on the native GaSb substrate by modifying the wafer structure shown in FIG. 1 described above such that the bottom n-type SCL is thicker, the top n-type SCL is much thinner or eliminated, and the top clad (which must have refractive index lower than that of the active ICL stages) is thinner than in conventional ICLs, as shown schematically in the cross-sectional end view in FIG. 6. As illustrated in FIG. 6, such an exemplary structure 600 includes an n+ GaSb substrate 101, n-type InAs—AlSb bottom clad 102, bottom n-type GaSb separate confinement layer (SCL) 103, active ICL stages 104, n-type InAs—AlSb top clad 106, and n+ InAs (Sb) contact 107 described above with respect to FIG. 1, but omits the top n-type GaSb SCL 105 of the wafer structure shown in FIG. 1. Again, transition superlattices that separate the various regions to smooth out abrupt shifts of the conduction band offset are not shown in the FIGURE. In a typical ICL from the prior art, such as that illustrated in FIG. 1, assuming emission at $\lambda=3.4$ μm, the bottom SCL 103 and top SCL 106 are both 750 nm thick, while the top clad 106 is 1.4 μm thick. In an analogous exemplary weakly-index-guided ICL of the invention such as that illustrated in FIG. 6, which emits at the same wavelength, the bottom SCL 103 is 1000 nm thick, the top SCL is eliminated, and the top clad 106 is 1-2 μm thick.

Figure 3:
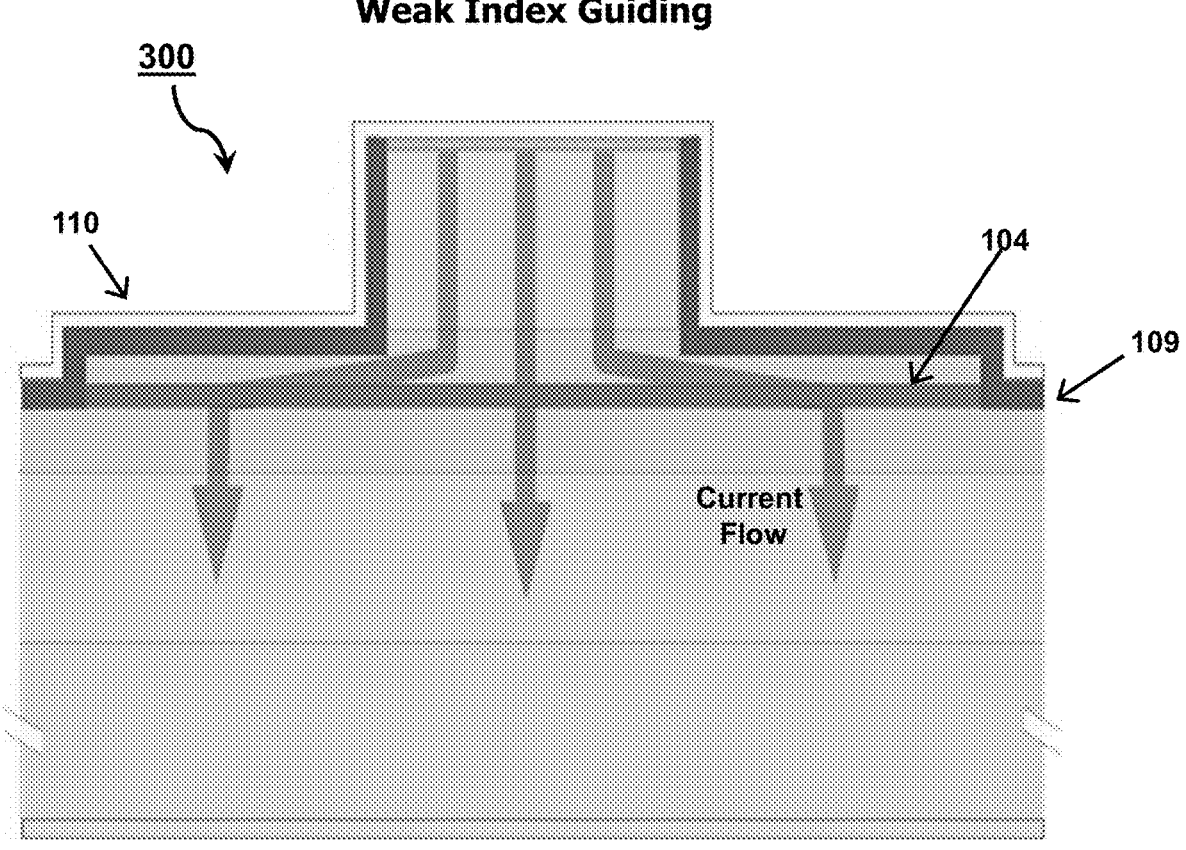
FIG. 3 is a block schematic illustrating aspects of etching a double ridge with inner and outer ridges in another exemplary ICL structure in accordance with the prior art.

In the partially-processed double-ridge structure 700 shown in FIG. 7, the inner ridge waveguide formed by the active ICL stages 104, n-type InAs—AlSb top clad 106, and n+ InAs contact 107 is etched to below the active stages to prevent lateral current spreading beyond the active ridge and to provide weak index guiding of the waveguide mode. Many embodiments employ no more than about 5 active stages because vertical penetration of the fundamental optical mode into the etched ridge is limited. Some embodiments employ only about 3 stages, which provides less gain but also reduces the drive power and increases the average optical confinement factor per stage, since the mode intensity decreases with increasing height within the inner ridge. The inner ridge may be wider than in a conventional strongly (abruptly) index-guided ICL, but should not be so wide that significant lasing occurs in multiple lateral modes. The outer ridge, which is analogous to the outer ridge shown in FIG. 3 illustrating the prior art, is defined by the boundaries of the lower n-type GaSb SCL. The boundaries of the outer ridge are not shown in FIG. 7 since the laser performance will not depend on the outer ridge width as long as the outer ridge is at least a few wavelengths wider than the inner ridge on each side of the inner ridge. This is because the fundamental lateral lasing mode does not extend very far into the outer ridge, and current spreading is eliminated by the etch of the inner ridge to below the active stages. This insensitivity to outer ridge width applies to all of the weakly-index-guided embodiments of the invention discussed below. The outer ridge may be formed by etching to below the bottom n-type SCL, or simply by cleaving the semiconductor chip.

Figure 7:
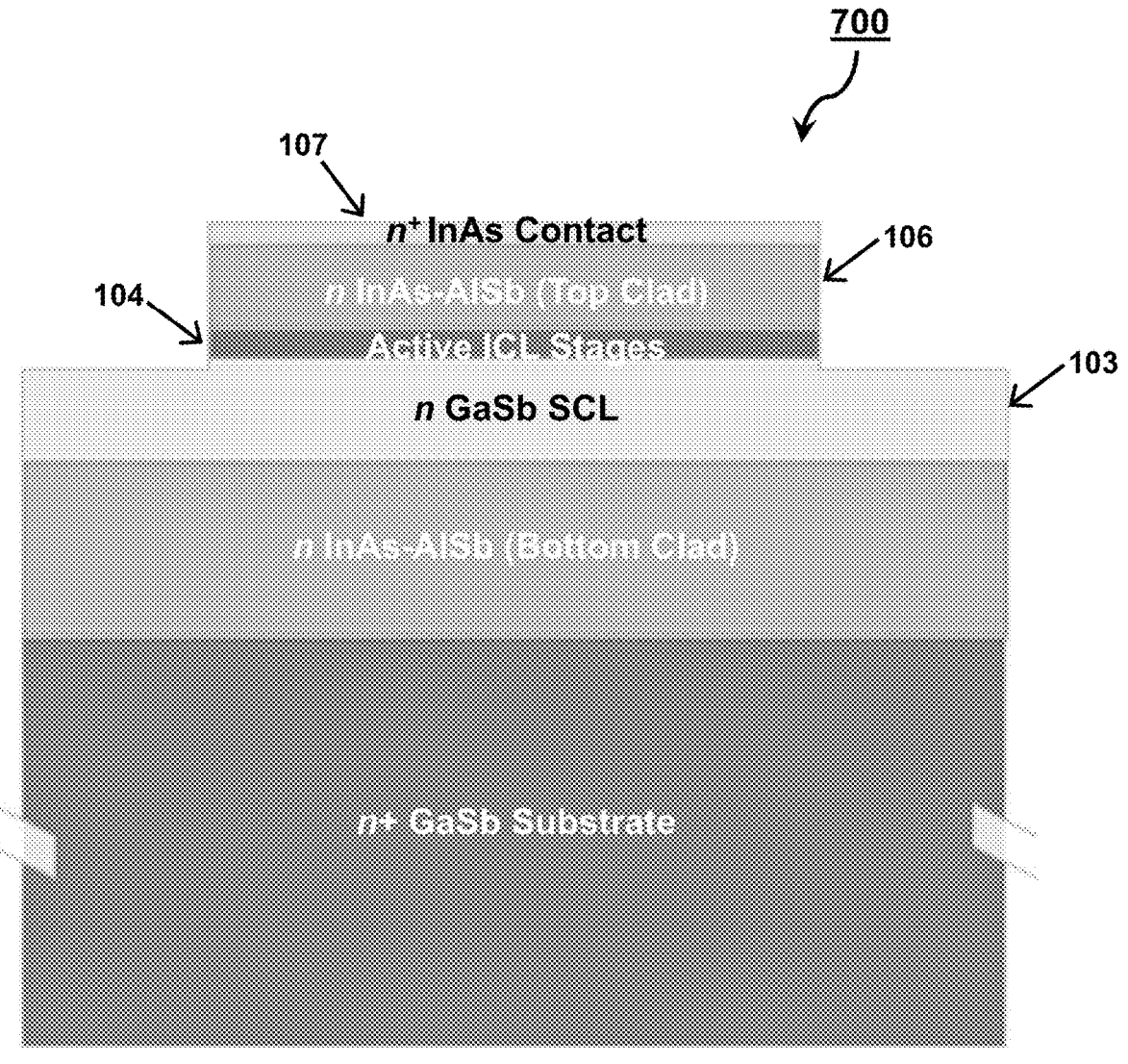
FIG. 7 is a block schematic illustrating an exemplary partially processed ICL having the layer structure illustrated in FIG. 6 and an etch of an inner ridge waveguide to a depth below the active stages of the ICL in accordance with one or more aspects of the present invention.
Figure 8:
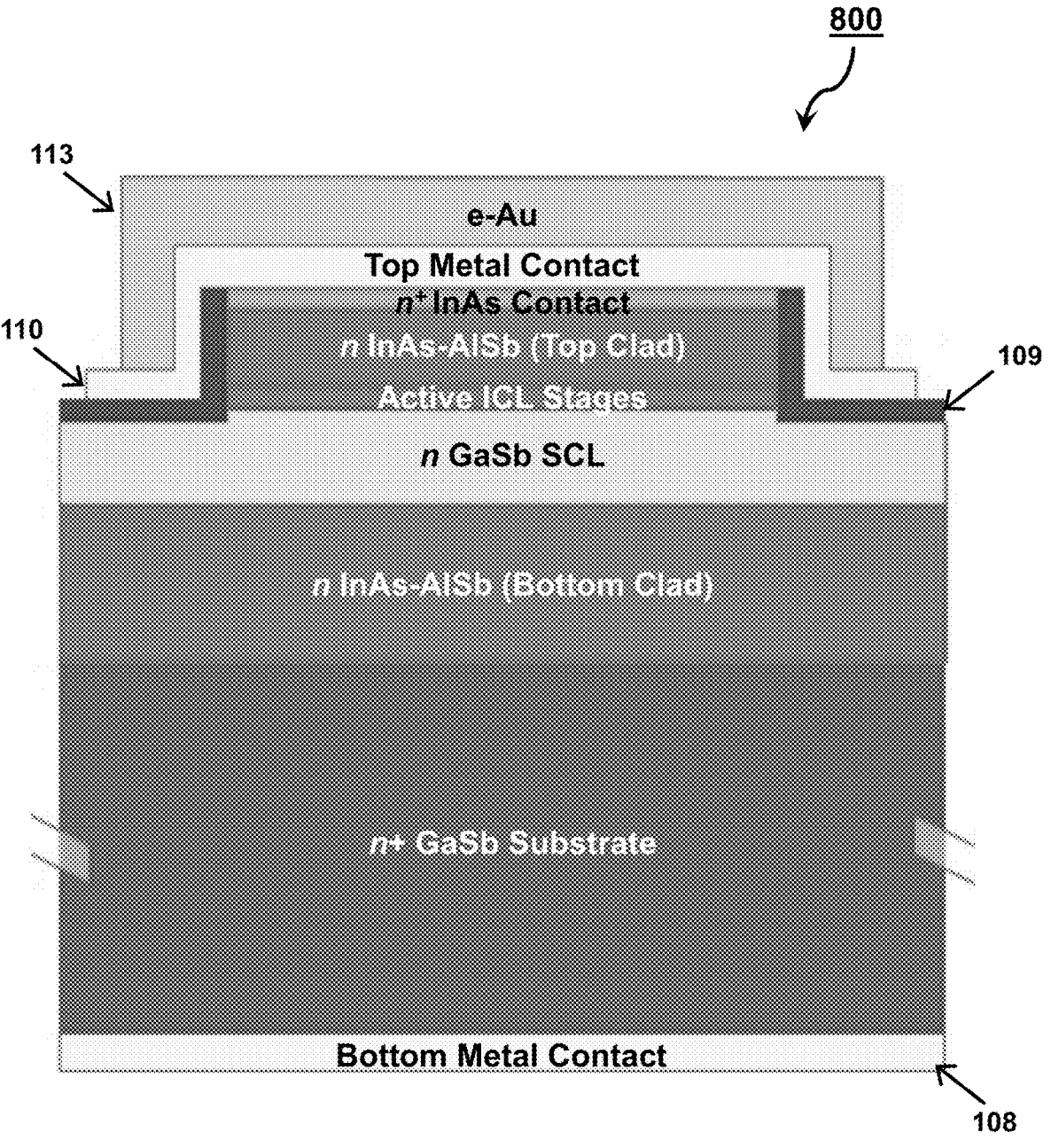
FIG. 8 is a block schematic illustrating the ICL inner ridge waveguide of FIG. 7 following deposition of an insulating dielectric on the ridge sidewalls, metallization to form a top electrical contact, and electro-plating with Au (e-Au) in accordance with one or more aspects of the present invention.

FIG. 8 schematically illustrates a more-completely processed ICL 800 having the same basic structure as the etched ICL double-ridge waveguide shown in FIG. 7, where, as with the structure shown in FIG. 7, the boundaries of the outer ridge are not shown. In addition, in the structure shown in FIG. 8, an insulating dielectric layer 109 such as a SiN or SiO$_2$ layer is deposited on the sidewalls of the inner ridge, the top of the inner ridge is metallized (e.g., with Ti/Pt/Au) to form an electrical contact 110, and the top of the structure is optionally electro-plated with Au layer 113 to a preferred thickness of ≈3-6 μm. In some embodiments such as structure 900 shown in FIG. 9, individual double-ridge waveguide ICLs (outer ridge not shown) are singulated and then mounted epi-down on a heat sink 114 by means of solder 115, as shown schematically in the FIGURE.

Figure 2:
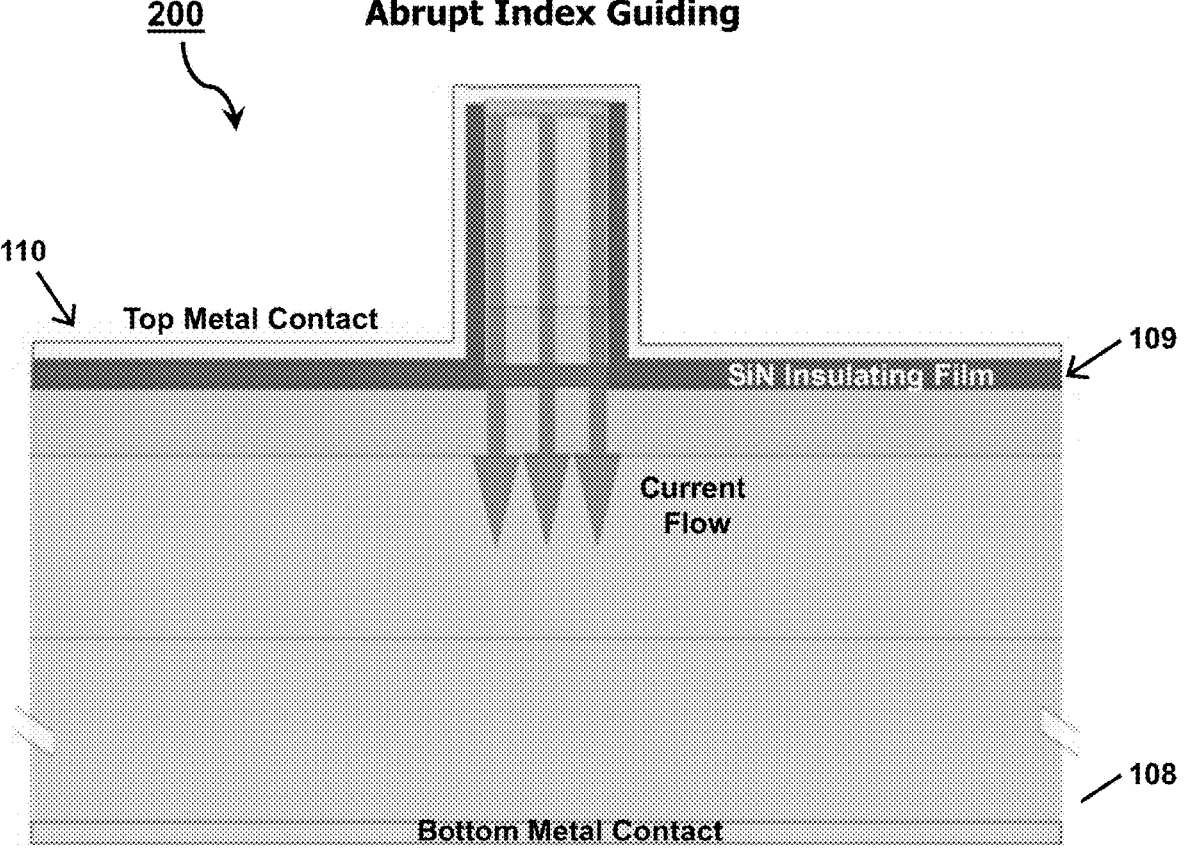
FIG. 2 is a block schematic illustrating aspects of narrow ridge etching in an exemplary ICL structure in accordance with the prior art.

It has been observed experimentally that a conventional ICL, which employs an abruptly-index-guided waveguide similar to that shown schematically in FIG. 2, tends to operate stably in a single lateral mode only when the ridge is ≤5 μm wide. For a typical 7-stage ICL from the prior art with symmetric top and bottom GaSb SCLs, assuming SCL thickness 0.75 μm, ridge width w=5 μm, and emitting at $\lambda=3.4$ μm, simulations project an optical confinement factor of 15.7% in the active stages. The corresponding ratio of confinement factors for the second-order vs. fundamental TE modes is 0.957, which is confirmed experimentally to provide sufficient discrimination of the relative gains to assure strong selectivity of the fundamental mode. However, when the abruptly-index-guided ridge width is increased to 10 μm, the ratio of optical confinement factors for the two lowest-order modes increases to 0.996. This is insufficient gain discrimination to prevent multi-mode lasing.

Figure 9:
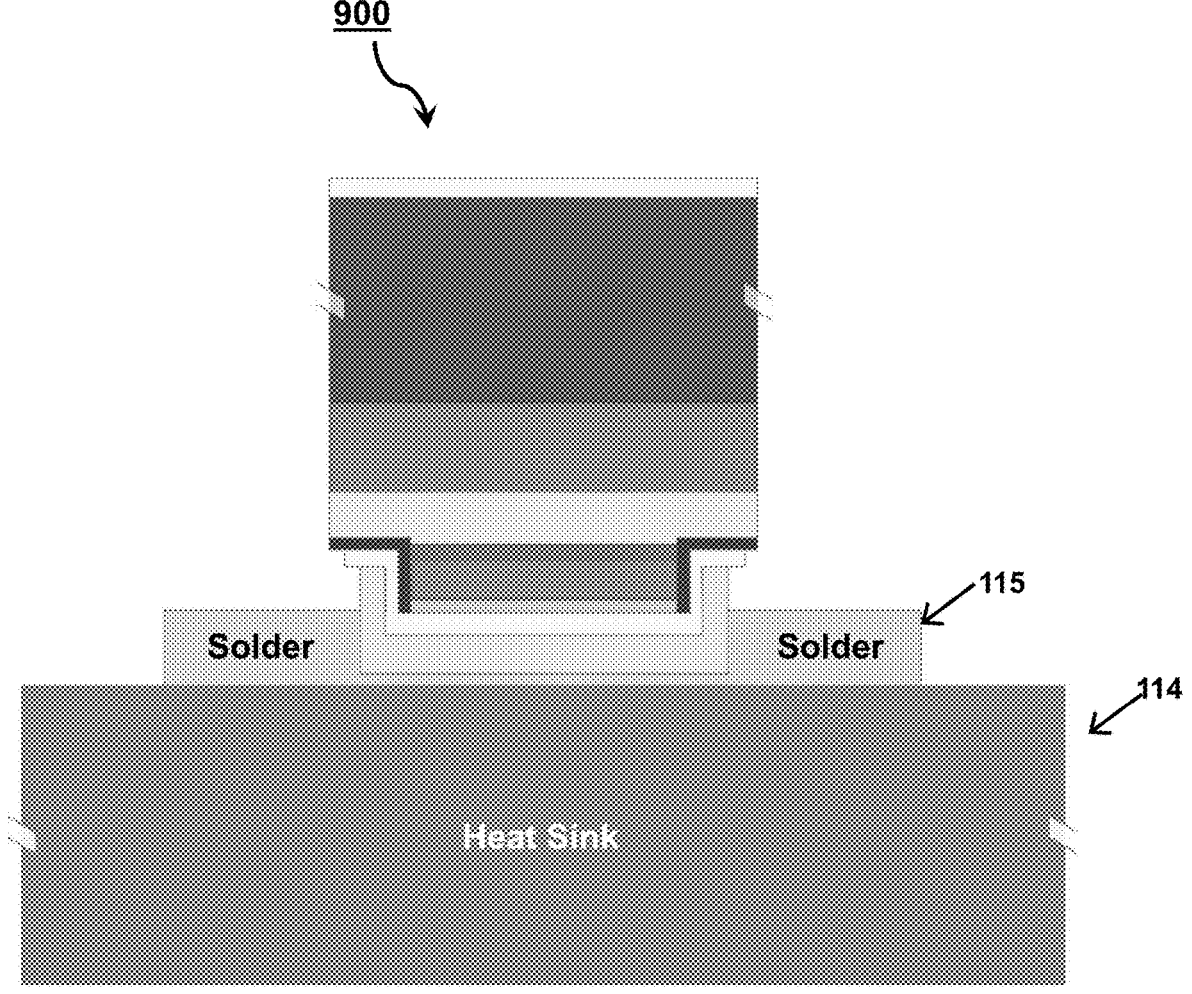
FIG. 9 is a block schematic illustrating the Au-electro-plated weakly-index-guided ICL inner ridge waveguide of FIG. 8 soldered epi-down to a heat sink in accordance with one or more aspects of the present invention.

The embodiments 800 and 900 of the invention illustrated in FIGS. 8 and 9 have no top SCL and the high-index GaSb forming the bottom SCL is much thicker than in the conventional ICL layering design of FIG. 1. As a result, most of the optical mode occupies the region below the active stages, allowing weak index guiding even though the etch that defines the inner ridge proceeds to a depth below the active gain stages. Simulations of the mode selectivity as a function of waveguide parameter space find that a preferred embodiment of an ICL with 5 active stages and emitting at $\lambda=3.4$ μm has a bottom clad thickness≈2.7 μm, SCL thickness≈1.0 μm, and top clad thickness≈1.0 μm. The simulations project that a 10-μm-wide inner ridge with this design has an optical confinement ratio of 0.958 between the two lowest-order TE modes, which we saw above is sufficient to provide stable single-mode lasing even though the inner ridge is much wider. Although the threshold current density may increase somewhat because the optical confinement factor in the active stages decreases to 7.4%, it is anticipated that this will be acceptable due to the ICL's relatively high material gain, low threshold current density, and low internal losses of the SCLs where most of the mode resides. And even this penalty can be eliminated by decreasing the SCL thickness in the preferred embodiment slightly, to 0.8 μm. The optical confinement factor then increases back to 10.5%, with a mode confinement ratio of 0.976 for the 10-μm-wide inner ridge and 0.954 for an 8-μm-wide inner ridge. Besides providing stable lasing in a wider inner ridge, the invention will provide less scattering loss at the inner ridge sidewalls. The primary disadvantage is reduced heat extraction at the sidewalls of the wider inner ridge.

B. Weakly-Index-Guided ICLs Grown on Silicon

It was recently demonstrated by researchers at the University of Montpellier that ICLs grown on a silicon substrate with a highly-mismatched lattice constant can display high performance despite the presence of very high dislocation densities in the $10^8$ cm$^{-2}$ range [Cerutti et al., *Optica* 8, 1397 (2021), "Quantum well interband semiconductor lasers highly tolerant to dislocations"]. This is attributed to positioning of the dislocation-associated trap energy levels above the conduction band minimum or below the valence band maximum, so they do not contribute excessively to defect-assisted non-radiative recombination via mid-gap states. The ICL structure in that study was grown on a 1.5-μm-thick GaSb buffer layer that was grown first on the silicon, after which the bottom InAs—AlSb superlattice clad, bottom GaSb SCL, active gain stages, top GaSb SCL, top superlattice clad, and top capping layer were grown. The grown structure was then processed into narrow-ridge waveguides with top electrical contact to the capping layer and bottom contact to the bottom superlattice cladding layer.

Figure 10:
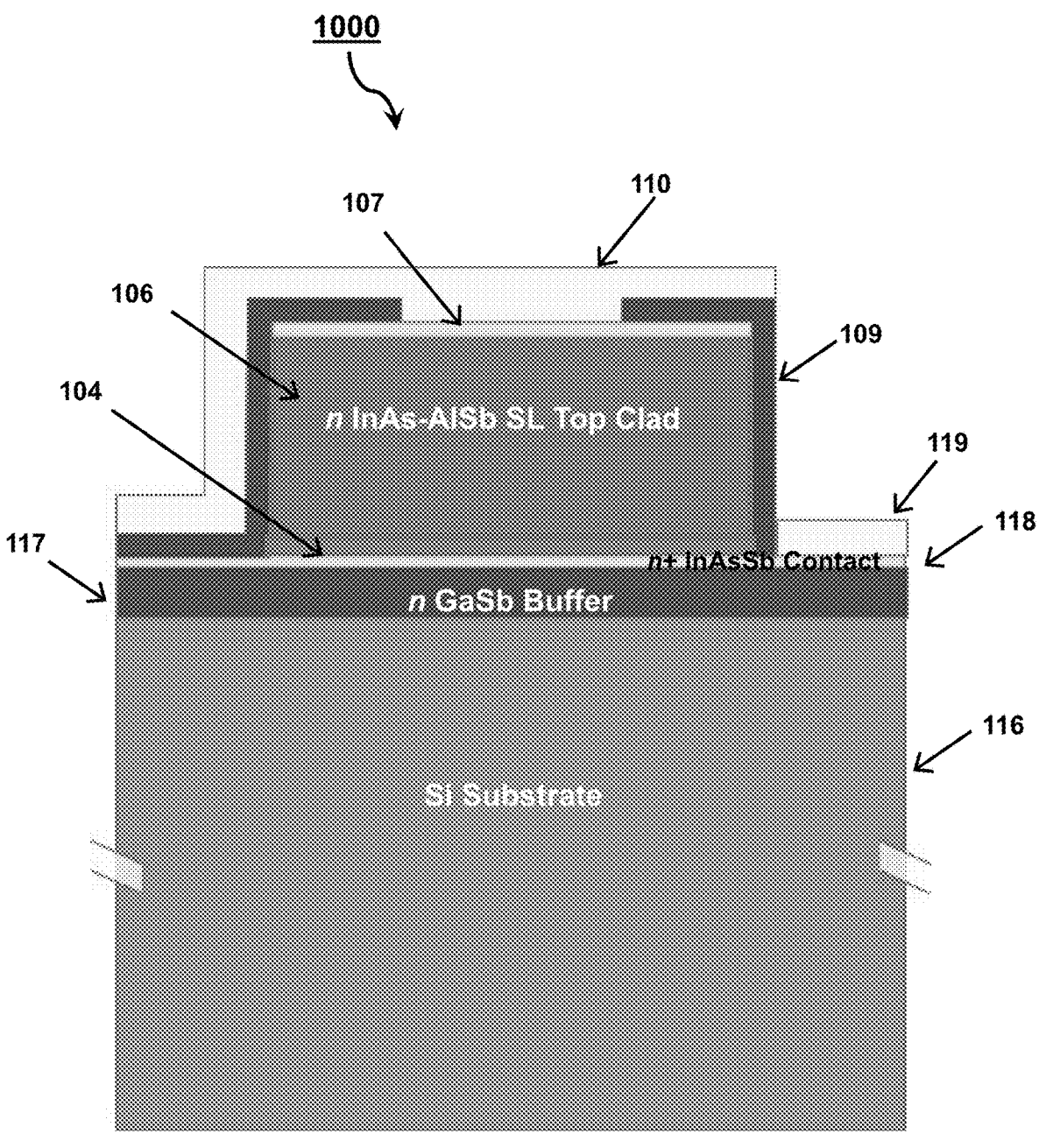
FIG. 10 is a block schematic illustrating an exemplary weakly-index-guided ICL grown on a silicon substrate and having an inner ridge waveguide in accordance with one or more aspects of the present invention.

FIG. 10 schematically illustrates an embodiment 1000 of the invention in which the layers of the ICL design (ICL epilayers) are grown epitaxially on a silicon substrate 116, with most of the same layers as the structures described above with respect to FIGS. 7 and 8, except that the bottom InAs—AlSb superlattice cladding layer and bottom GaSb SCL are omitted so that only a thin heavily-n-doped contacting layer 118 (which may be InAsSb, an InAs—AlSb superlattice, or another suitable material) separates the active ICL stages 104 from the GaSb buffer layer 117 and silicon substrate 116. The GaSb buffer layer 117, which can be lightly-n-doped e.g., for low optical loss and can have a thickness of 1-1.5 μm, then functions as the bottom SCL and the silicon substrate 116 provides the bottom optical cladding. The top optical cladding, which in this exemplary embodiment is an InAs—AlSb superlattice, should have a lower refractive index than the active ICL stages. One advantage of this structure is efficient heat dissipation via the silicon substrate 116, which has high thermal conductivity and is separated from the active gain stages only by the GaSb buffer/SCL 117 and the thin contact layer 118. In particular, the InAs—AlSb superlattice cladding layer that contributes substantial thermal resistance in a conventional ICL is eliminated.

This embodiment provides weak index guiding because most of the optical mode resides within the GaSb buffer layer that extends laterally beyond the boundaries of the inner ridge. This is analogous to the weakly-index-guided structure 900 illustrated in FIG. 9, except that the GaSb buffer layer that functions as the SCL now lies below the active stages rather than above, and heat sinking occurs via the silicon substrate rather than the "top" metal contact and Au-electroplating. The inner ridge may be wider than in a conventional strongly (abruptly) index-guided ICL, but should not be so wide that significant lasing occurs in multiple lateral modes.

A further advantage of this embodiment of the invention is that the laser cavity can be terminated on at least one end by an etched facet of the mesa that stops at or near the top of the GaSb buffer/SCL, as illustrated in FIG. 10. In this embodiment, the adjacent portion of the GaSb buffer/SCL, which is now exposed to air (or a dielectric) because the layers above it were etched away, can then function as a passive waveguide as was discussed for the case of a GaSb bottom SCL of an ICL grown on GaSb in Meyer *Sensors* 2021, supra, and in Meyer et al., U.S. Pat. No. 11,125,689, Sep. 21, 2021, "Highly Stable Semiconductor Laser for III-V and Silicon Photonic Integrated Circuits." Coupling between the active and passive waveguides will be efficient, since a large fraction of the optical mode in the laser section already resides in the GaSb buffer/SCL.

In a related embodiment, a thick lower InAs—AlSb superlattice cladding layer is grown above the GaSb buffer layer 117 (which in this embodiment need not be n-type because the optical mode will not penetrate to the buffer layer), followed by an n-type GaSb lower SCL, both of which are below the active ICL stages 104 in a configuration similar to that in FIG. 7. In this case, the optical mode resides primarily in the n-type GaSb lower SCL rather than the GaSb buffer layer, which is sufficiently separated from the mode by the lower InAs—AlSb cladding. This embodiment has the advantage that light does not reside in the GaSb buffer layer, which has a higher dislocation density and potentially higher optical absorption than the subsequent GaSb SCL layer. Furthermore, the optimal thickness of the GaSb buffer layer may not be the same as the optimal thickness of the lower SCL, whereas in this embodiment both thicknesses can be optimized independently. In this embodiment, an InAsSb contact layer 118 may be grown below or above the GaSb SCL layer, or below the InAs—AlSb lower cladding. Alternatively, the InAs—AlSb lower cladding can be used as a contact layer, or a highly doped InAs—AlSb contact layer can be grown above the InAs—AlSb lower cladding.

C. Weakly-Index-Guided ICLs Integrated on Silicon by Heterogeneous Bonding

Similar inventive design principles may be used to realize weakly-index-guided ICLs for which the III-V gain chip, which is grown on a GaSb or InAs substrate, is integrated on silicon by heterogeneous bonding. This integration can apply to any silicon-based substrate, which we use to refer to any Si-based platform in which materials conventionally used in silicon-based processing may or may not be disposed on top of a bare silicon substrate chip. The Si-based substrate may be a bare Si chip or a silicon chip with one or more other layers disposed on top, such as Si-on-SiO$_2$-on-Si (silicon-on-insulator, or SOI), Si-on-SiN-on-SiO$_2$-on-Si (silicon-on-nitride-on-insulator, or SONOI), Ge-on-Si (GOS), Ge-on-SiO$_2$-on-Si (Ge-on-Insulator, or GOI), Ge-on-Si-on-SiO$_2$-on-Si (GOSOI) or any similar Si-based material system where layers of dielectric, crystalline, amorphous, or other materials have been integrated on top of a silicon wafer prior to integration with the ICL material. Such a Si-based substrate can be acquired commercially.

One such embodiment follows the approach described above for processing weakly-index-guided ICLs on the native GaSb substrate. In such an embodiment, the III-V gain chip is designed with a thicker bottom SCL, very thin or no top SCL, and no top clad. The layers are grown on the native GaSb substrate in reverse order compared to the previous embodiments. The structure is heterogeneously bonded, epitaxial-side-down, to a silicon-based substrate having a top layer of refractive index lower than that of GaSb, such as Si, using procedures described previously, e.g., in Spott 2018, supra. After the GaSb growth substrate is removed, the ICL inner ridge is etched to a depth slightly below the active gain stages, and again the largest fraction of the optical mode resides in the thickened top GaSb SCL (which is now on the bottom of the structure when it is bonded epi-down to silicon). In such embodiments, the silicon-based substrate, which can be pre-patterned with a DFB or other grating, then serves as the bottom optical cladding layer rather than the conventional InAs/AlSb superlattice. This embodiment will exhibit weak index guiding as in the ICL embodiments described above that attain weak index guiding when processing is on the native GaSb substrate.

However, other embodiments of weakly-index-guided ICLs integrated on Si employ a germanium layer or a layer of some other material (such as a SiGe alloy) which can have a refractive index higher than that of the cladding layer of the III-V chip and of at least one underlying layer in the Si-based substrate. In many embodiments, a single-crystal Ge layer is advantageous due to its high refractive index relative to silicon, higher thermal conductivity, and lower defect density, although amorphous Ge may also be employed. In some of those embodiments, the III-V gain chip is bonded epitaxial-side-down to a Si-based substrate where Ge is the top layer, such as GOS or GOI. The Si-based substrate may be a bare silicon chip, or layers of various other materials such as SiO$_2$, SiN, and/or Ge may be deposited on top of the silicon substrate chip. Either the underlying silicon substrate chip or one or more of the layers deposited on the top of the Si-based substrate may be pre-patterned, for example with a DFB grating, distributed Bragg reflector (DBR) grating, discrete mode grating, photonic crystal grating, and/or other pattern that is required for the PIC, before the III-V gain chip is bonded. In some preferred embodiments, a DFB or other grating is etched into the top surface of the Ge layer that is the top layer of the Si-based substrate. The III-V gain chip with active ICL stages may again be grown on a GaSb or InAs substrate.

Figure 11:
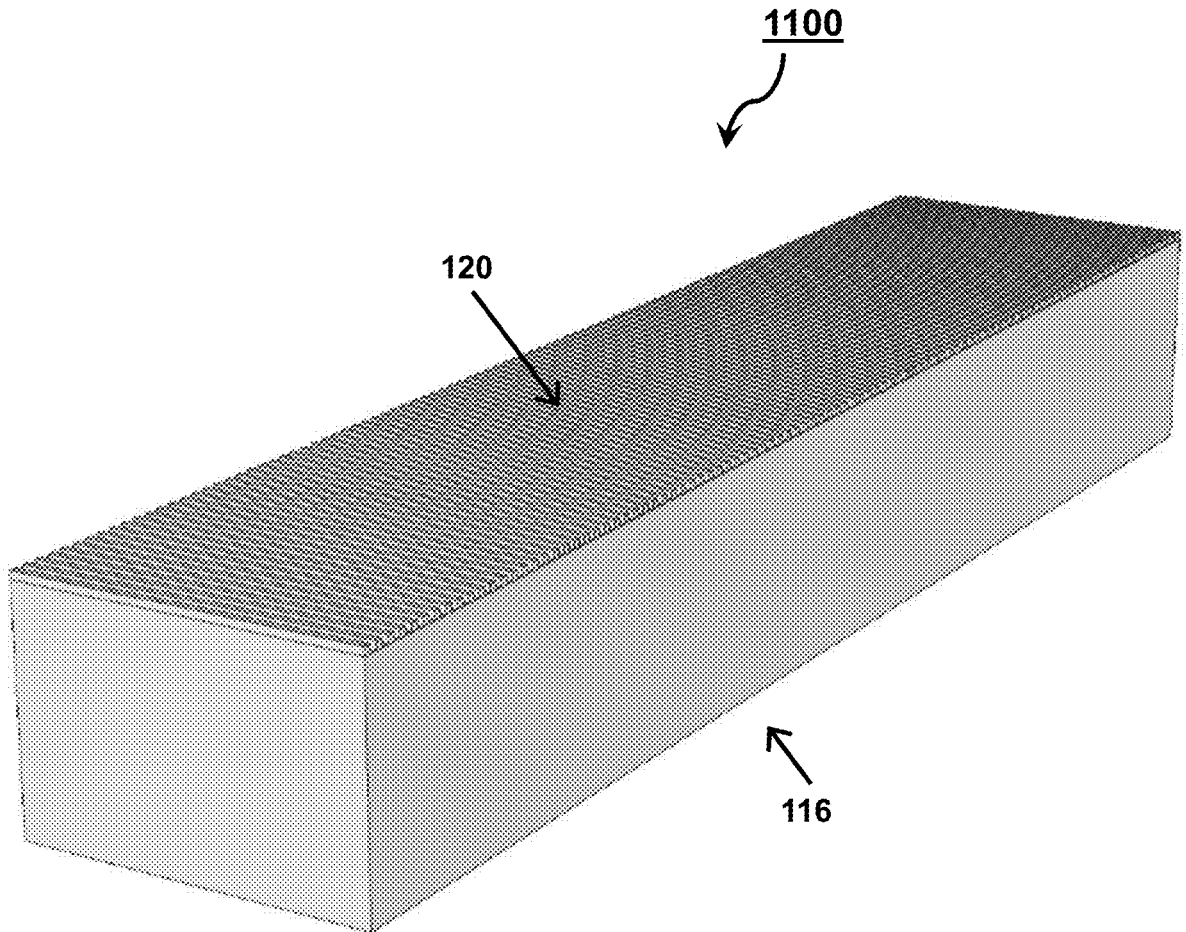
FIG. 11 is a block schematic illustrating a silicon substrate having a distributed feedback (DFB) grating etched into the top surface in accordance with one or more aspects of the present invention.
Figure 12:
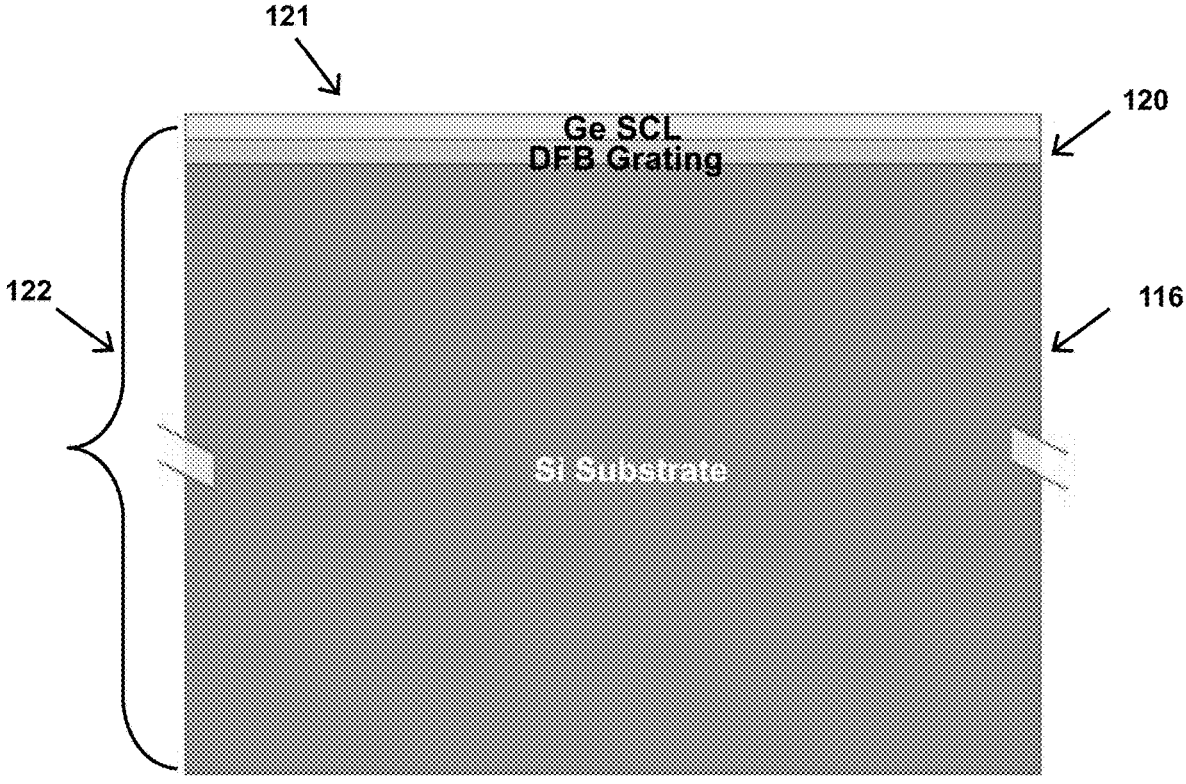
FIG. 12 is a block schematic illustrating an exemplary cross-sectional end view of the layers in the silicon-based substrate with a Ge layer disposed on the DFB grating patterned on the top of the silicon substrate in accordance with one or more aspects of the present invention.

In other embodiments, a silicon-based substrate having a top layer of material with refractive index lower than Ge is pre-patterned with the required gratings before the Ge layer is disposed on top. In a preferred embodiment, the required grating is patterned on top of silicon 116, as shown in FIG. 11, or $SiO_2$. For these embodiments a thin Ge layer may first be grown by chemical vapor deposition (CVD) on an $SiO_2$ layer on the surface of a separate carrier Si-based substrate. The Ge layer should have low surface roughness and defects for high quality growth, but there may be defects in the interface between the Ge and $SiO_2$. The Ge surface is then bonded to the pre-patterned Si surface. The carrier substrate is removed from the Ge layer by some combination of mechanical lapping and/or reactive ion etching, and the remaining $SiO_2$ layer is removed with a hydrofluoric acid (HF) or buffered hydrofluoric acid (BHF) solution. The surface of the remaining Ge layer, which may have surface roughness or surface defects due to the $Ge/SiO_2$ growth interface, is then prepared for III-V bonding by chemical mechanical polishing (CMP) for smoothing, or by some other method known to the art before the III-V substrate is bonded, if necessary. The block schematic in FIG. 12 illustrates a cross-sectional end view of the Ge-on-Si substrate 122 following bonding of the Ge and removal of its carrier substrate, so as to provide a Si-based substrate with Ge layer 121 comprising a Si substrate 116, with an optional DFB or other grating 120 pre-patterned into its surface, and the thin single-crystal Ge layer 121, with a preferred thickness of about 250 nm, on top. The Ge must be sufficiently thick that a sufficient fraction of the fundamental lateral optical mode in the fully-processed laser lies below the active ICL stages to impose weak index guiding.

Figure 13:
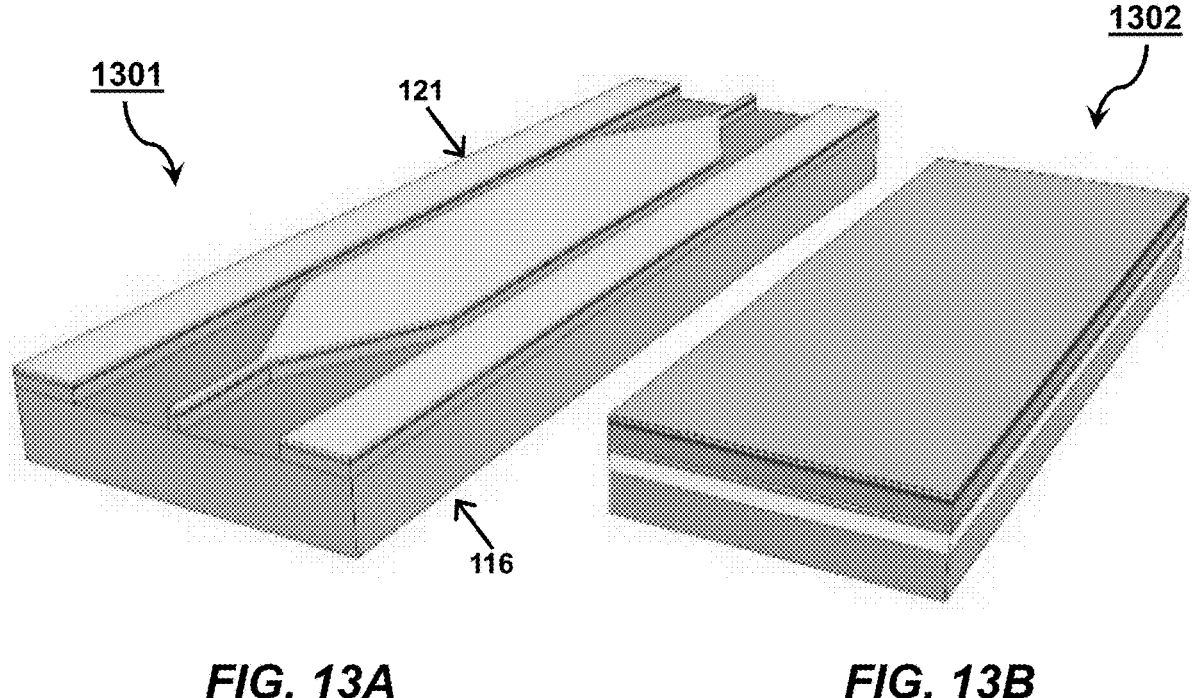
FIGS. 13A and 13B are block schematics illustrating aspects of ICL laser formation on a silicon-based substrate, where

FIG. 13A schematically illustrates aspects of an embodiment 1301 in which the Ge-on-Si substrate is pre-patterned to incorporate a wide Ge SCL ridge 121 (the outer ridge of the weakly index guided laser) terminated on both ends by tapers that will ultimately provide coupling of the hybrid gain waveguide to a relatively narrow, single-mode Ge-on-Si waveguide. FIG. 13B schematically illustrates a portion of the III-V GaSb-based gain chip 1302 before it is heterogeneously bonded to the pre-patterned Ge-on-Si substrate of FIG. 13A.

FIG. 14 schematically illustrates the layering in an exemplary GaSb-based III-V gain chip 1400 before it is heterogeneously bonded to the silicon-based (Ge-on-Si, Ge-on-$SiO_2$-on-Si, or Si) substrate. This exemplary structure comprises the GaSb substrate 101, a GaSb buffer layer (not shown), an InAsSb etch stop layer 123, a sacrificial GaSb layer 124, a contact layer 118 (which may be $n^+$-InAs, $n^+$-InAsSb lattice-matched to GaSb, or some other heavily-doped layer), an InAs/AlSb superlattice cladding layer 102, which may again be relatively thin, active ICL stages 104, and an $n^+$-InAs contact 107. Transition superlattices (not shown) are again incorporated between these regions to smooth abrupt variations of the conduction band offset. An additional InAs/AlSb superlattice cladding layer could optionally also be incorporated between the active ICL stages 104 and the n+-InAs contact 107. The III-V gain chip 1302 is bonded epitaxial-side-down to the pre-patterned Si-based substrate 1301. After bonding, the GaSb substrate 101, the InAsSb etch stop 123, and the GaSb sacrificial layer 124 are removed by a combination of mechanical lapping and a series of selective chemical etches in the process described previously, e.g., in Spott 2018, supra. The purpose of the InAsSb etch stop layer is to slow the chemical etching of the GaSb to allow the GaSb to be removed without etching other layers. The InAsSb etch stop layer is similarly removed by chemical etching, which is slowed by the GaSb sacrificial layer 124 that is inserted for this purpose. The GaSb sacrificial layer is also removed by selective chemical etching which is slowed by the n+ InAsSb contact which is the final resulting top surface after bonding, substrate removal, etch stop removal, and sacrificial removal steps. Other methods of removing the GaSb substrate after heterogeneous bonding are known to the art, including various combinations of dry plasma etching, chemical mechanical polishing, and mechanical lapping, and any such methods can be used, and use of all such removal methods is deemed to be within the scope of the present invention. A "smart-cut"-like process known in the art can also be applied, where ion implantation is performed on the III-V wafer prior to bonding to introduce a planar defect layer at a precise depth which serves to facilitate severing of the bulk of the III-V substrate from the relevant epilayers bonded to silicon. Typically, a smart-cut process would be followed by chemical mechanical polishing to leave a planar smooth III-V surface.

Figure 15:
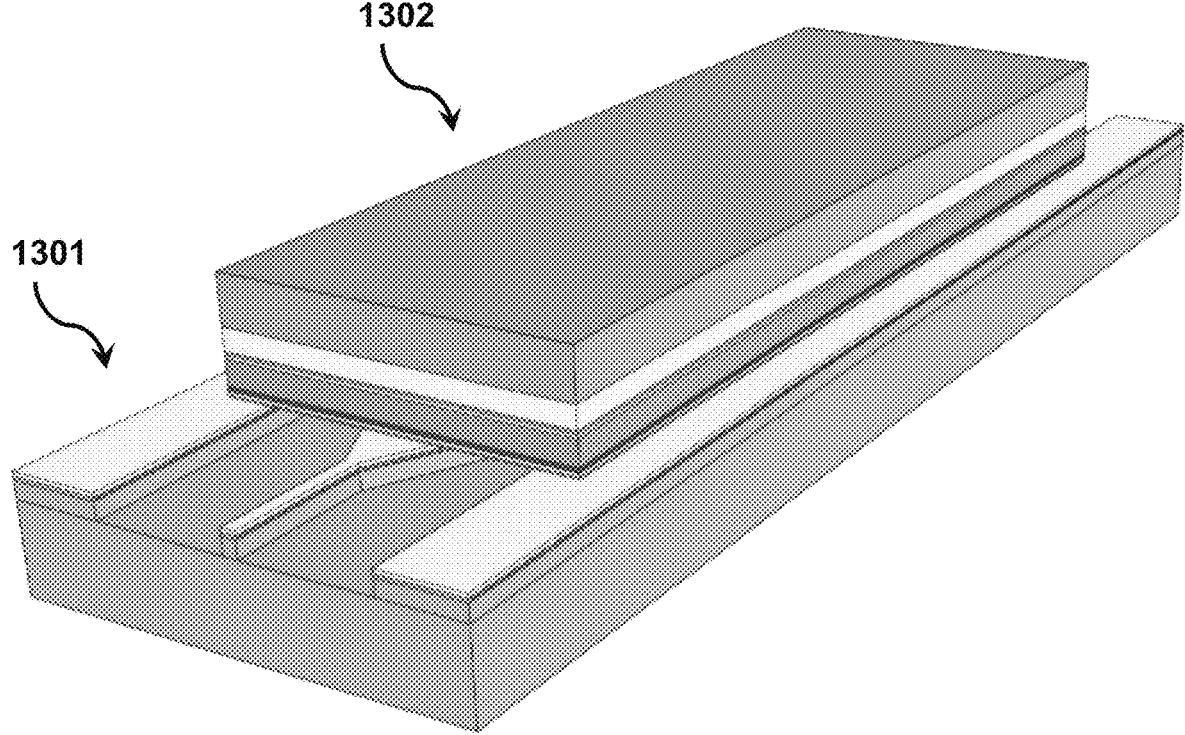
FIG. 15 is a block schematic illustrating an exemplary III-V active gain die such as that illustrated in FIG. 14 heterogeneously bonded to a pre-patterned silicon-based substrate such as that illustrated in FIG. 12 before any processing of the III-V chip in accordance with one or more aspects of the present invention.

FIG. 15 schematically illustrates a partially-processed exemplary embodiment following heterogeneous bonding of the III-V gain chip 1302 to the patterned silicon-based substrate 1301. The subsequent processing steps are to etch away the GaSb substrate 101, with the etch stopping on the InAsSb etch stop layer 123; etch away the InAsSb etch stop layer 123 and the sacrificial GaSb layer 124 to leave the $n^+$ InAsSb contact layer 118 exposed on top; etch the ICL inner ridge 125 to below the active ICL stages 104, stopping on the $n^+$ InAs contact 107 (which was grown on top but is now on the bottom); deposit SiN dielectric 109 uniformly on the surface and the sidewalls of the inner ridge; etch vias to leave openings on portions of the $n^+$ InAsSb contact 118 and also on portions of the $n^+$ InAs contact 107 so as to leave an opening for the bottom contact pad; and deposit metal to form the top contact 110 and bottom contact 119.

Figures 16A, 16B:
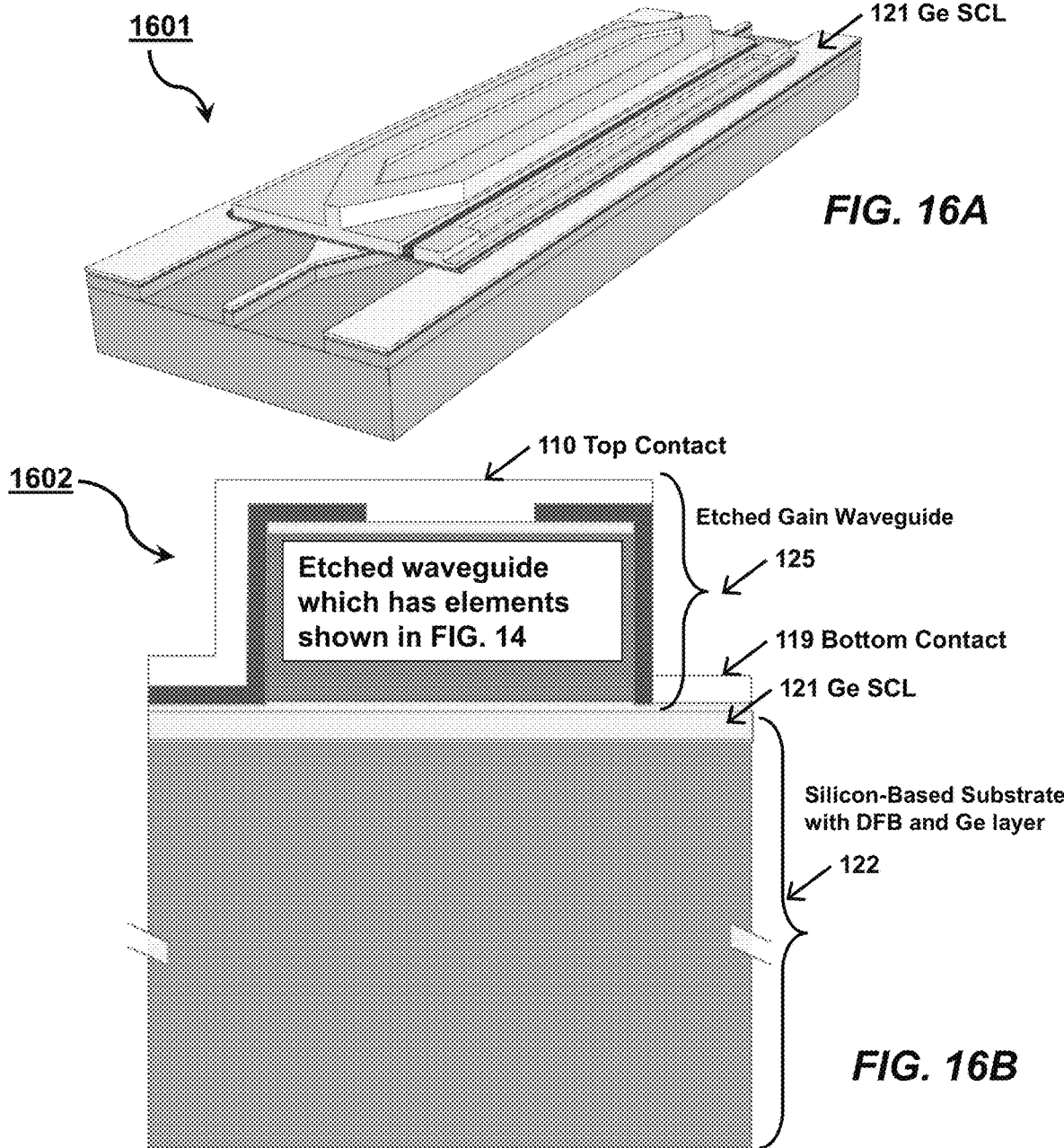
FIGS. 16A and 16B are block schematics illustrating aspects of an ICL integrated on a silicon-based substrate in accordance with the present invention, where

The resulting integrated ICL double-ridge waveguide comprising an etched gain waveguide 125 situated on a Si-based substrate with DFB grating and a Ge layer 121 is illustrated schematically in 3D view 1601 in FIG. 16A and in cross-sectional end view 1602 in FIG. 16B, where the boundaries of the outer ridge are not shown. The inner ridge may be wider than in a conventional strongly (abruptly) index-guided ICL, but should not be so wide that significant lasing occurs in multiple lateral modes. As discussed above for embodiments that induce weak index guiding on a native GaSb substrate, the laser performance will be insensitive to the width of the outer ridge (which is defined by the boundaries of the Ge SCL layer 121) as long as the outer ridge is at least a few wavelengths wider than the inner ridge.

FIGS. 17A and 17B show electric field profiles of the TE00 (FIG. 17A) and TE10 (FIG. 17B) optical modes simulated for the hybrid III-V/Ge/Si waveguide of the weakly-index-guided ICL on a silicon-based substrate as shown in FIGS. 16A and 16B. Such an ICL functions very much like the weakly-index-guided ICL processed on the native GaSb substrate discussed above with respect to FIGS. 6-9, except that in the ICLs shown in FIGS. 16A/16B, a high-index Ge layer 121 functions as the SCL rather than GaSb layer 103 as in the structure shown in FIGS. 6-9. Again, the inner ridge is etched through the active stages to prevent lateral current spreading, whereas most of the optical mode, occupying the SCL, is unconfined by the inner ridge. Weak index guiding then provides greater optical confinement of the fundamental lateral mode within the active ICL stages in the inner ridge as compared to the higher-order modes.

For reasons similar to those discussed above for weakly-index-guided ICLs processed on the native GaSb substrate, many embodiments employ as few as 3 and no more than 5 active stages, with an exemplary embodiment of a 5-stage ICL integrated on silicon that emits at λ=3.4 μm having a top clad thickness≈3 μm and Ge SCL thickness≈250 nm. Simulations project that for waveguide widths 10-20 μm, 29% of the fundamental optical mode occupies the Ge SCL. The optical confinement factor in the active stages is 9.105% for the fundamental optical mode (TE00) and 8.924% for the TE10 mode, for a ratio of 0.980. We see again that for a given inner ridge width, weak index guiding more effectively discriminates against lasing in higher-order modes than a conventional abruptly-index-guided structure from the prior art, with the consequence that single-mode lasing will remain stable to a much greater inner ridge width. As discussed below, the integrated ICL with weak index guiding may be intended for singulation and use as a stand-alone laser, or it may couple to a germanium waveguide as shown in FIGS. 12-15 for functioning as a laser source component in a PIC.

D. Weakly-Index-Guided DFB ICLs Integrated on Silicon

A significant advantage of the weakly-index-guided DFB ICL integrated on silicon illustrated in FIG. 16A is that the etched gratings in the silicon-based substrate will be of extremely high quality due to the maturity of silicon-based processing. This also holds for embodiments that begin with a commercial Ge-on-Si substrate, with grating etched into the top of the Ge before the III-V die is heterogeneously bonded. In those embodiments, weak index guiding is maintained only when the grating is shallow enough that a significant portion of the optical mode remains in the Ge SCL. However, it is straightforward to comply with that condition since sufficient coupling for single-mode operation can be obtained when the grating depth is only about 10 nm.

The conventional processing technologies for DFB ICLs, for which no overgrowth capability is available, have lower yield because they are intrinsically more challenging as well as less mature. As discussed above, conventional DFB ICLs must be processed by etching a grating into the top of the epitaxial structure, which substantially increases the optical loss because the mode necessary overlaps the top metal contact [Meyer et al., U.S. Pat. No. 9,923,338, Mar. 20, 2018, "Interband Cascade Lasers with Low-Fill-Factor Top Contact for Reduced Loss"]. Or the grating is patterned at the sides of the ridge, which substantially limits the maximum coupling strength [Forouhar, supra].

It is further advantageous that coupling of the optical mode to the grating can be extremely strong. Since the Ge SCL that hosts a large fraction of the mode lies immediately adjacent to the grating, which is etched into the Ge itself or can be etched quite deeply into the silicon, the practical upper limit of the grating coupling coefficient is much higher than for a conventional DFB ICL in which the grating is etched into the III-V material. This is especially the case for ICLs, for which a single-mode laser with a deeply-etched top grating is very inefficient because strong overlap of the optical mode with the grating inevitably imposes strong overlap with the top contact metal as well. Or the grating is positioned at the sides of the ridge and the maximum strength of the lateral coupling is intrinsically limited. The pre-patterned silicon-based substrate or grating etched into the Ge can also provide a sampled grating or related architecture, which allows Vernier tuning of the single-mode output wavelength [Kim, IEEE Phot. Tech. Lett. 16, 15 (2004), "Design and Analysis of Widely Tunable Sampled Grating DFB Laser Diode Integrated With Sampled Grating Distributed Bragg Reflector"].

The invention's advantage of implementing a strong grating without compromising other aspects of the laser performance is also important in the case of discrete mode (DM) structures [Herbert et al., IET Optoelectron. 3, 1 (2009), "Discrete mode lasers for communication applications"]. Conventional DM laser processing on the native III-V substrate requires that one or more notches of length longer than the emission wavelength be etched into the top of the narrow ridge, and that the notch depth and overlap with the optical mode must be sufficient to provide a high coupling coefficient. Pre-patterning the notches into the Ge SCL or silicon substrate will provide strong coupling without introducing loss or compromising the structural quality of the III-V inner ridge.

A further advantage of the weakly-index-guided integrated ICLs of the invention is minimization of the total waveguide loss, since a large fraction of the optical mode is concentrated in the low-loss Ge SCL and underlying silicon while much smaller fractions occupy the bottom contact layer, active stages, and top clad. Furthermore, scattering losses due to imperfections in the processing of a patterned structure such as a 1D or 2D grating, as well as scattering due to non-uniformities in the sidewalls of the etched inner ridge, are greatly reduced due to the more perfect gratings patterned in silicon or germanium rather than the III-V material, and because the propagating mode experiences less overlap with the inner ridge sidewalls. The latter results from both the wider inner ridge that maintains single-mode operation and the lower vertical depth of the mode profile that places it below the etched inner ridge sidewalls. With a lower net loss due to all of these effects, the laser can operate with less gain and therefore lower optical confinement factor related to the mode's vertical penetration into the active stages. The lower loss will also enhance the wallplug efficiency (WPE) of the laser.

Figure 18:
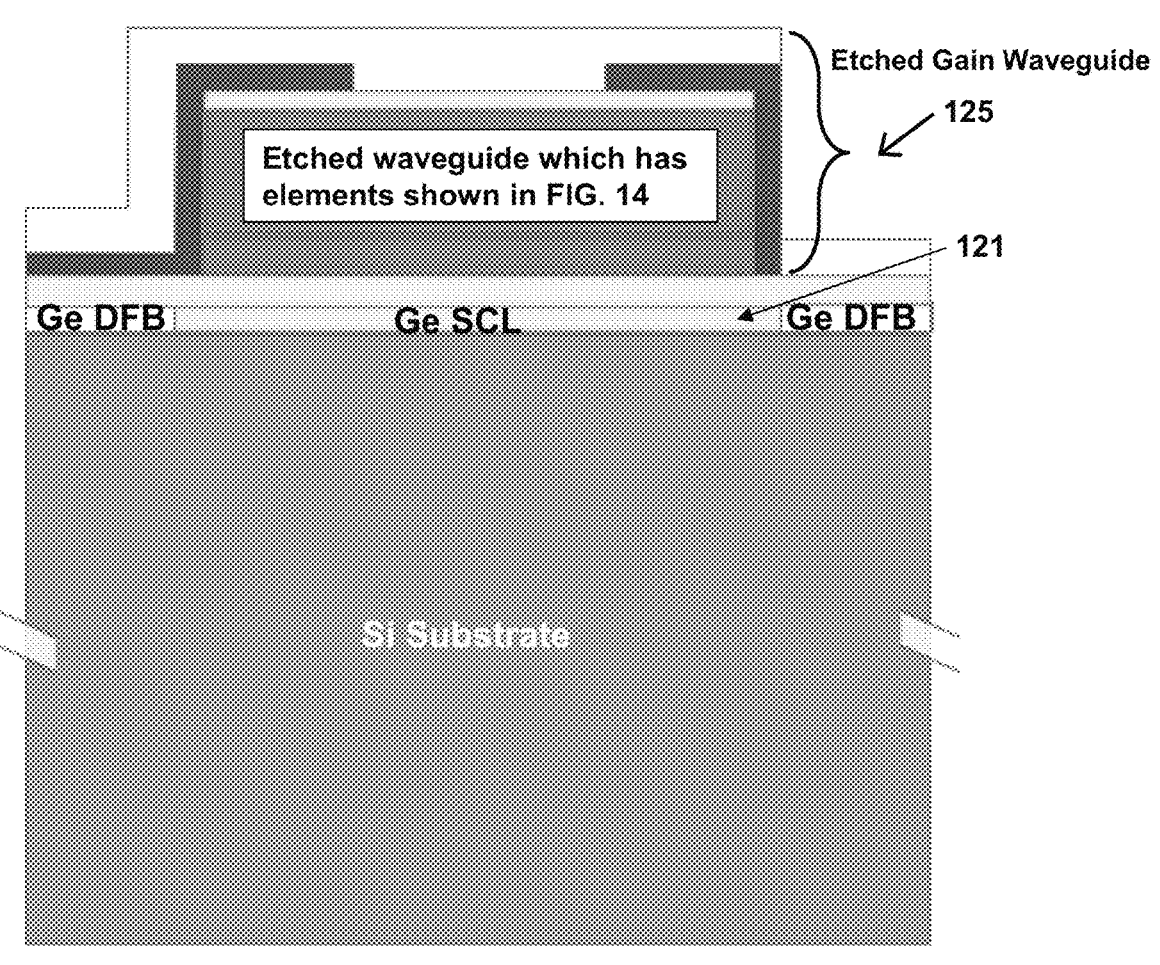
FIG. 18 is a block schematic showing a cross-sectional end view of an exemplary embodiment of a weakly-indexguided ICL integrated on silicon in accordance with one or more aspects of the present invention, in which a lateral DFB grating is etched into the Ge SCL on each side of the inner ridge.

In other embodiments of the invention, the DFB grating 120 for a weakly-index-guided ICL integrated on silicon is etched into the Ge SCL in portions of the outer ridge that are lateral to each side of the inner ridge, as illustrated schematically in FIG. 18, rather than in a portion of the Si-based substrate that lies directly underneath the inner ridge. In this configuration 1800, the lateral displacement between the III-V inner ridge of the etched ICL gain waveguide 125 mounted on the silicon-based substrate and the grating etched into the Ge SCL must be wide enough to maintain weak index guiding, but still narrow enough to provide sufficient coupling of the mode to the grating for robust selection of a single longitudinal mode. Such gratings can be rectangular, circular, or otherwise arbitrarily shaped.

A further advantage of the weakly-index-guided integrated DFB ICLs of the invention is that the silicon-based substrate that may contain a grating not only provides spectral selectivity for emission in a single spectral mode, but also serves as the top portion of a low-loss lower clad. Therefore, an InAs—AlSb short-period superlattice bottom clad is not needed. This simplifies the growth, and also eliminates the thermal resistance associated with a III-V grown bottom clad layer. In fact, only a thin contact layer separates the active stages from the excellent heat sink provided by the Ge SCL and silicon substrate. Single-crystal Ge and Si have much higher thermal conductivities than all the III-V binaries, ternaries, and short-period multiple quantum wells that separate the heat sink from the active stages of a conventional ICL processed on the III-V substrate (e.g., the structure such as that shown in FIG. 2 when it is mounted epi-down). Furthermore, when a grating is etched into the Si or Ge SCL, the coupling coefficient of the grating can be traded against even lower thermal resistance by increasing the duty cycle of the Si or Ge sections of the grating to a value above 50%, and achieving the same grating strength by making the grating deeper. Lateral gratings discussed above may also reduce the thermal resistance because the etched portion of the Ge SCL is further laterally separated from the heat generated in the active ICL stages.

When the silicon substrate of the integrated ICL of the invention is thermally bonded to a heat sink, the resulting vertical pathway with low thermal resistance can provide superior heat dissipation without the additional processing steps required for epitaxial-side-down mounting or flip-chip bonding. With improved heat dissipation combined with single-mode emission from a wider inner ridge, it is anticipated that weakly-index-guided DFB ICL embodiments of the invention will emit higher cw output power in a single spectral mode than any existing ICLs. Alternatively, ICL embodiments that employ a reduced number of active stages (e.g., as few as 3) will experience lower thermal resistance between the heat sink and the most remote stage, which will provide a further reduction of the threshold drive power.

Even if the top of the silicon substrate is flat rather than being patterned with a DFB grating for spectral selectivity as shown in the exemplary embodiments of FIGS. 11-13, 15, and 16, the refractive index of the flat silicon is still low enough to provide the bottom clad layer for an integrated ICL.

For some applications, edge emission from the laser cavity is desired. For example, the light may couple to a passive silicon- or germanium-based output waveguide if the laser functions as a source component in a PIC, or the light may be output at a facet when a large number of edge-emitting ICLs are mass produced in parallel for singulation into individual devices. In embodiments that involve singulation of the individual lasers, facets that define the two ends of the laser cavity may be formed by cleaving the hybrid wafer material, or the end facets may be etched before singulation. In either case the facets may be left uncoated, or opposite facets may be HR and AR coated using methods known to the art. If the facets are etched, they may be coated either before or after the singulation into individual devices. In embodiments where the integrated ICL functions as a source component in a PIC, output to a passive waveguide may be provided by a taper as discussed above with respect to FIGS. 5, 13A, 15, and 16A, at a partially-reflecting distributed Bragg reflector (DBR), at a notch that induces a variation in the refractive index, or some other means known to the art.

In some embodiments, the internal feedback imposed by coupling to a pre-patterned DFB grating can be so strong that no end facets are required to form the laser cavity. For example, simulations project that when the emission wavelength is $\lambda$=3.4 $\mu$m, a 1st-order DFB grating with 50% duty cycle and etch depth 10 nm will provide coupling coefficient 108 cm$^{-1}$ for the weakly index-guided integrated ICL illustrated in FIGS. 16A/16B.

The large grating coupling coefficient can also provide sufficient internal feedback for lasing when the length of the cavity (which may not have end facets) is very short. For example, the simulated coupling coefficients specified above imply that the cavity for a weakly-index-guided integrated ICL such as that illustrated in FIGS. 16A/16B can be as short as $\approx$200 nm. This is shorter than is practical to cleave using conventional methods, and would induce too much mirror loss for lasing even if a conventional R/U Fabry-Perot cavity of that length could be cleaved. An ICL from the prior art with cavity length 0.5 mm has already displayed the lowest drive power (29 mW) for any MWIR semiconductor laser [Vurgaftman 2011, supra], and the even shorter cavity provided by the invention will reduce this minimum even further. For a 5-stage ICL with inner ridge width 12 $\mu$m and emitting at $\lambda$=3.4 $\mu$m with a total loss of 7 cm$^{-1}$, simulations project that a threshold current density as low as $\approx$220 A/cm$^{-2}$ will be attainable for cw operation at room temperature, which corresponds to a drive power as low as $\approx$10 mW. For spectroscopic chemical sensing or other optical system powered by batteries, minimized drive power for longer battery lifetime will be a valuable feature. Embodiments of weakly-index-guided integrated DFB ICLs that employ as few as 3 stages may operate with even lower drive power.

A further advantage of embodiments of the invention that provide integrated ICLs with very short cavities is that minimization of the footprint per device will allow more devices to be processed in parallel on a single silicon wafer.

E. Enhanced Coupling to a Passive Waveguide

As discussed above, it is envisioned that ICLs integrated on silicon by heterogeneous bonding will provide attractive source components for MWIR photonic integrated circuits. However, this integration approach relies on the efficient transfer of light generated in the active hybrid III-V/Si waveguides into passive silicon-based waveguides. In the near-IR, efficient coupling to the passive waveguides has been realized by tapering the active hybrid waveguide as illustrated in FIG. 5 [Komljenovic, supra]. However, thus far every attempt to apply this approach in the MWIR has resulted in very low coupling efficiency [Spott 2018, supra], with only a small fraction of the light generated in the active hybrid waveguides reaching the passive waveguides. In fact, at present the poor efficiency for coupling to passive waveguides represents the greatest hurdle restraining the implementation of high-performance MWIR PICs.

Figure 4:
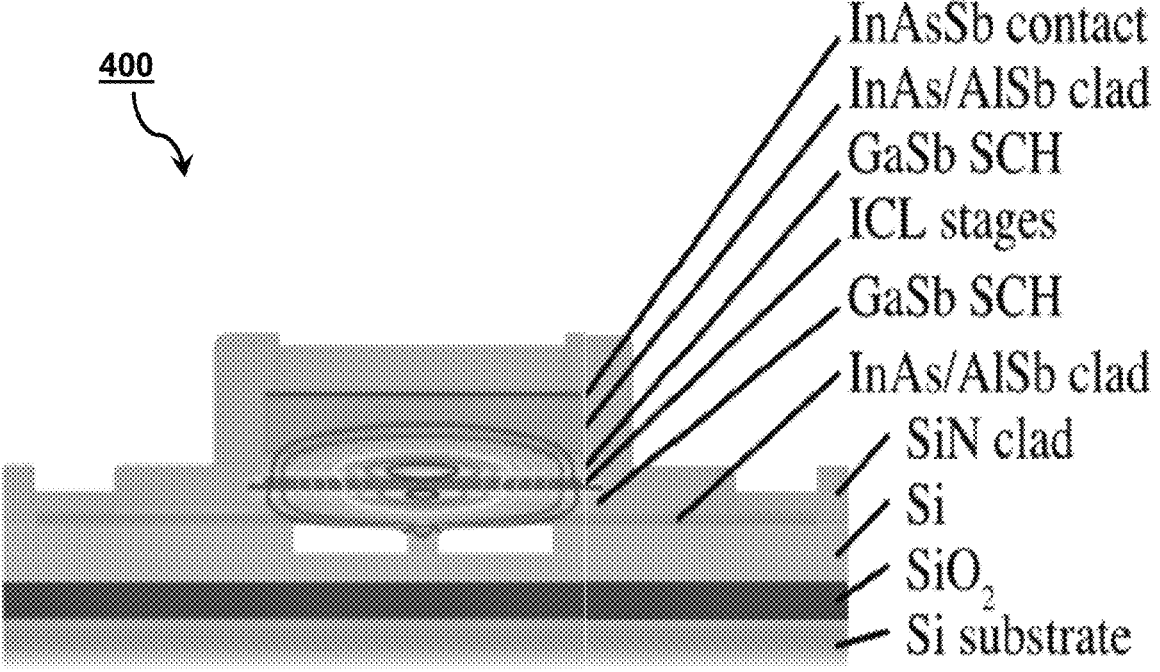
FIG. 4 is a block schematic illustrating a cross-sectional end view of an ICL integrated on a silicon-on-insulator (SOI) substrate in accordance with the prior art.

FIG. 4 discussed above includes an overlay of a simulation of the optical mode profile in the hybrid waveguide of an ICL integrated on silicon for a layering design from the prior art [Spott Optica 2018, supra]. The mode in the structure illustrated in FIG. 4 is seen to reside primarily in the III-V gain and top clad layers, with relatively little penetration into the underlying silicon portion of the hybrid waveguide. This poor overlap has been a primary factor limiting the efficiency of coupling to the passive waveguide. On the other hand, the TE00 mode profile in FIG. 17A, corresponding to a weakly-index-guided integrated ICL of the invention, has far greater overlap because it is concentrated primarily in the Ge SCL lying just above the silicon substrate that functions as the bottom clad. This shifts the active mode toward the mode in the passive Ge/Si waveguide, which in many embodiments has a Ge core and Si bottom clad. It will be beneficial to minimize the thicknesses of the bonding and contact layers to the extent possible. The close vertical alignment imposed by architectures taught by the invention will substantially improve the optical transfer efficiency at a taper. In some embodiments, the preferred thickness of the Ge SCL layer in the active III-V/Ge/Si waveguide differs from that in the Ge/Si passive waveguide. In those embodiments, a second Ge taper step can transfer light between passive waveguides with different Ge core thicknesses.

In some embodiments of the invention, the thin Ge layer that provides an SCL for an ICL integrated on silicon can also provide a useful SCL for a detector bonded on the same silicon chip. In some of those embodiments, an MWIR detector is processed from the same wafer material that provides gain for an ICL source. An interband cascade detector (ICD) can be formed by processing a narrow inner ridge such as that illustrated schematically in FIG. 16B and operating at zero or small reverse bias rather than forward bias [Lotfi et al., *Appl. Phys. Lett.* 109, 151111 (2016), "Monolithically integrated mid-IR interband cascade laser and photodetector operating at room temperature"; *Meyer Sensors* 2021, supra]. In other embodiments, one or more detectors are formed by heterogeneously bonding different III-V, IV-VI, II-VI, Group IV, or other wafer materials to a pre-patterned Ge/Si substrate that may also incorporate MWIR sources and passive optical elements. A wide variety of possible III-V detector structures, such as those employing type-II InAs—GaInSb superlattice and InAs—InAsSb superlattice absorbers, are known to the art [Rogalski et al., *Prog. Quant. Electron.* 68, 100228 (2019), "Type-II super-lattice photodetectors versus HgCdTe photodiodes."].

The presence of a Ge SCL layer below the heterogeneously-bonded MWIR detector structure can have several advantages. First, the significant challenge of coupling light generated by an integrated ICL source from the hybrid active waveguide to a passive Si-based waveguide at a taper, due to poor overlap of the mode profiles, applies equally to the challenge of efficiently coupling light propagating in a passive Si-based waveguide into a hybrid MWIR detector waveguide if the two modes are similarly misaligned. However, just as positioning a substantial fraction of the laser waveguide's mode in the low-loss Ge SCL can substantially improve the output coupling efficiency from an integrated ICL, it can also substantially improve the input coupling efficiency to a hybrid III-V/Ge/Si detector waveguide. A related advantage is that efficient transfer to the hybrid detector waveguide minimizes the light reflected back to the laser source that produced the light. Reduced parasitic optical feedback will optimize the stability of integrated laser sources [U.S. Pat. No. 11,125,689, supra].

A further advantage is that the Ge SCL or top of the silicon substrate can be pre-patterned with a very strong DFB grating to provide feedback of the beam propagating in the hybrid waveguide at some resonance wavelength. For detector embodiments that incorporate a DFB grating, multiple passes of the beam through the hybrid waveguide can provide high absorption quantum efficiency in a shorter active detector length than would be possible in the absence of feedback. Consequently, the specific detectivity D* at the resonance wavelength will be higher because the dark current scales linearly with length of the active absorber. Although a related resonance effect was proposed previously for in-plane detectors by using DBRs to confine the resonant cavity [U.S. Pat. No. 11,125,689, supra], the use of a DFB for feedback rather than a DBR at each end of the cavity is much more straightforward. Furthermore, a grating in the Ge or deep DFB grating patterned into the silicon substrate can provide very strong feedback, allowing a short absorption length to provide high quantum efficiency. Stronger coupling also tends to broaden the resonance spectrum somewhat. In some embodiments of the invention, a series of DFB sections having different grating pitches are connected in series so that each section is sensitive to a selected band of wavelengths centered on a given resonance peak.

When an ICL emitter structure functions as an interband cascade detector by operating at zero or reverse bias, the absorption length is already relatively short due to strong interband absorption in the multiple active stages. However, pre-patterning a DFB grating to select a wavelength band and shorten the waveguide length needed for high quantum efficiency will be especially advantageous when applied to GaSb-based p-n junction and nBn detector configurations [A. Rogalski et al., *Appl. Phys. Rev.* 4, 031304 (2017), "InAs/GaSb type-II superlattice infrared detectors: Future prospect"] that are specially designed with only one or a few absorbing quantum wells and therefore weak absorption per unit waveguide length. Whether or not a DFB grating is patterned to provide resonance, many embodiments of integrated detectors incorporate a top cladding layer. e.g., an InAs/AlSb superlattice similar to the ICL cladding layers, in order to minimize optical losses induced by overlap of the propagating mode with the top contact metallization.

In some embodiments of the invention, the thin Ge layer at the top of a Ge/Si passive waveguide enhances evanescent coupling of the optical mode to an ambient sample gas or liquid, so as to increase the sensitivity of an on-chip chemical detection system. A limitation of chemical sensing PICs that combine one or more lasers, passive sensing waveguides, and detectors on the same chip is relatively weak evanescent coupling of the optical mode propagating in a conventional passive silicon waveguide to an ambient gas or liquid that may or may not contain an analyte of interest [U.S. Pat. No. 11,125,689, supra]. In many embodiments, both the top Ge layer and the top of the underlying silicon substrate of the passive sensing waveguide are patterned to provide maximum access of the ambient gas or liquid to the air spaces in between the pattern features. The strength of coupling between the optical mode and the ambient gas or liquid can be enhanced by patterning the passive sensing waveguide surface with a slot having sub-wavelength dimensions along the lateral (stronger TE coupling) [Almeida et al., *Opt. Lett.* 29, 1209 (2004), "Guiding and confining light in void nanostructure"] or vertical (stronger TM coupling) [Zhou et al., *J. Appl. Phys.* 123, 063103 (2018), "Fully suspended slot waveguide platform"] waveguide axis, with a subwavelength-scale grating along the longitudinal axis [Wangüemert-Pérez et al., *Opt. Lett.* 39, 4442-4445 (2014), "Evanescent field waveguide sensing with subwavelength grating structures in silicon-on-insulator"; Hogan et al., *Opt. Expr.* 27, 3169 (2019), "Mid-infrared optical sensing using sub-wavelength gratings"], with a photonic crystal structure [Khonina et al., *IEEE Sensors* 20, 8469 (2020), "Evanescent Field Ratio Enhancement of a Modified Ridge Waveguide Structure for Methane Gas Sensing Application"; Rostamian et al., *Conference on Lasers* and Electro-Optics, *Technical Digest* (2020), "Sub-Parts-Per-Million Level Detection of Ethanol using Mid-Infrared Photonic Crystal Waveguide in Silicon-on-Insulator"], or with some other patterned configuration known to the art. In these configurations, the high-index Ge layer at the top of the patterned passive waveguide enhances the coupling strength.

In other embodiments, a long longitudinal notch is etched into the top of the silicon substrate below the Ge waveguide core, to form a Ge membrane that is supported on each side by silicon. The Ge membrane provides strong evanescent coupling to an analyte gas or liquid that is ambient both above and below the membrane [Sanchez-Postigo et al., *Opt. Expr.* 29, 16867 (2021), "Suspended germanium waveguides with subwavelength-grating metamaterial cladding for the mid-infrared band"].

In some embodiments, DBRs are patterned into the Ge/Si passive waveguides at each end of the patterned Ge/Si passive sensing waveguide to provide an optical cavity that further enhances coupling to the ambient gas or liquid at the resonance wavelength of the cavity. In other embodiments, the Ge/Si passive sensing waveguide is patterned with a DFB grating to provide distributed feedback at a resonance wavelength that increases the effective pathlength of the passive sensing waveguide. In many embodiments, if the optical source is a single-mode laser the resonance wavelength of the cavity or DFB grating is matched to the single-mode emission wavelength.

F. Suppression of Sidewall Leakage in ICLs Integrated on Silicon

Another limitation of the ICLs integrated on silicon to date has been severe current leakage at the sidewalls of the ridge waveguides [Spott 2018, supra]. This may be attributed to the high density of n-type surface states that form on any etched InAs-based material [Affentauschegg and Wieder, *Semicond. Sci. Technol.* 16, 708 (2001) "Properties of InAs/InAlAs heterostructures"]. The cross-sectional schematic 1801 shown in FIG. 18A indicates that the top contact metallization of an ICL integrated on silicon using the design of the prior art extends to cover the sidewalls of the etched ridge. Therefore, when a negative bias is applied to the top contact to inject electrons and produce gain in the active stages, the ridge sidewalls experience a negative gate voltage. This voltage has the disadvantageous effect of exacerbating the accumulation of surface electrons, which may have contributed to the high surface leakage currents observed in the integrated ICLs [Spott 2018, supra]. The leakage was in fact more severe than is generally observed for conventional ICL ridges processed on the native GaSb substrate, even in cases where sub-standard device processing induced sidewall damage. It should also be noted that the voltage applied to a conventional ICL processed on the native GaSb substrate has the opposite polarity because in that case processing is from the top, in contrast to the processing from the bottom of an integrated ICL following removal of the substrate. It follows that the gate voltage experienced at the sidewalls of conventional ICL ridges is positive, having the opposite effect of removing electrons from the surface rather than increasing their density.

Figure 19A:
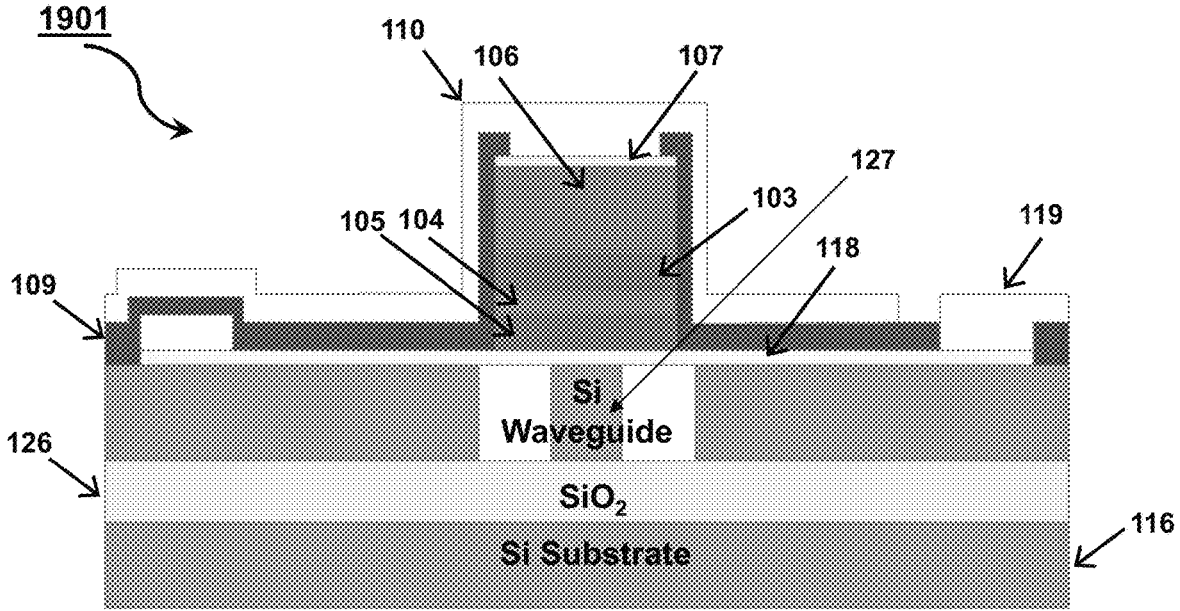
FIGS. 19A and 19B are block schematics illustrating cross-sectional end view schematics of a processed integrated ICL heterogeneously bonded to a silicon-based substrate from the prior art with sidewall gate voltage applied via the top contact (FIG. 19A), and having a Ge separate confinement layer (SCL) for weak index guiding and sidewall gate voltage applied via the bottom contact in accordance with one or more aspects of the present invention (FIG. 19B).
Figure 19B:
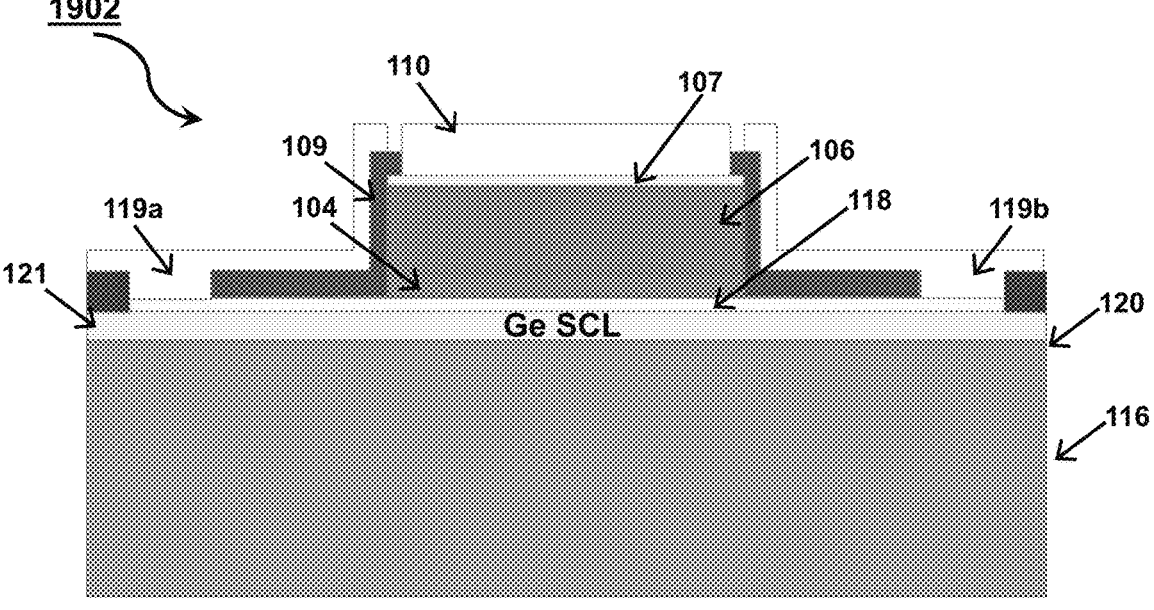

It is known that applying a positive gate voltage to the sidewalls of an InAs-based heterostructure can suppress surface leakage currents [Chen et al., *Appl. Phys. Lett.* 99, 183503 (2011), "Elimination of Surface Leakage in Gate Controlled Type-II InAs/GaSb Mid-Infrared Photodetectors"]. In some embodiments of the invention, the polarity of the gate bias experienced at the sidewalls of an ICL inner ridge integrated on silicon can be reversed by redesigning the contact configuration such that the sidewall metallization connects to the bottom rather than top contact. FIG. 19B schematically illustrates an embodiment of this configuration 1902, which may be expected to reduce the density of surface electrons at the sidewalls of the inner ridge when the ICL is forward-biased for gain, rather than increase their density as in the prior art configuration 1901 shown in FIG. 19A, in which a SiO$_2$ dielectric layer 126 is situated between a Si substrate 116 and a Si portion of the hybrid gain waveguide 127. In some embodiments, the effect of the gate voltage is enhanced by minimizing the dielectric thickness at the sidewalls to the extent possible while still preventing electrical shorting across the active gain stages.

In other embodiments of the invention, the growth order in the ICL active stages is reversed, such that when the ICL integrated on silicon is processed with sidewall gate voltage connected to the top contact as in the prior art, a forward bias extracts electrons from the top rather than injecting them. In other embodiments, a metal at the inner ridge sidewalls is not connected to either the top or bottom contact metals, such that a gate voltage may be applied to the inner ridge sidewalls that is independent of the voltage applied to forward bias the laser.

G. Surface-Emitting ICLs Integrated on Silicon

In some embodiments of the invention, the grating etched into the top surface of the silicon substrate is a 1$^{st}$-order grating that can provide single-mode output from one or both ends of the laser cavity. In other embodiments, it is a 2$^{nd}$-order DFB grating, which can provide diffraction of the laser light vertically from the plane of the grating [Macomber et al., *Appl. Phys. Lett.* 51, 472 (1987), "Surface-Emitting Distributed Feedback Semiconductor Laser"; Evans and Hammer, editors, *Surface Emitting Semiconductor Lasers and Arrays*, Chapter 4 (Academic Press, Boston, 1993); and Lyakh et al., *Appl. Phys. Lett.* 91, 181116 (2007), "Substrate-Emitting, Distributed Feedback Quantum Cascade Lasers"]. Although light will be emitted in both the upward and downward directions, a metal reflector coated on the top or bottom surface can redirect the light striking that surface to the output surface in the opposite direction. For example, reflection from the top contact of the integrated ICL 1601/1602 shown in FIG. 16 will redirect upward-emitted light to the downward direction for output. In some embodiments, the device is flip-chip-bonded to a heat sink and the output light is emitted from the bottom surface of the silicon substrate. In some embodiments that emit light from the silicon substrate, the bottom surface is coated with a single- or multi-layer dielectric coating that provides anti-reflection at the emission wavelength. In some embodiments, the first layer of the contact metal can be a pure noble metal such as silver or gold that provides maximum reflection and minimum absorption of the reflected light [Canedy et al., *Optics Express* 27, 3771 (2019), "Resonant-Cavity Infrared Detector with Five-Quantum-Well Absorber and 34% External Quantum Efficiency at 4 μm"]. In some embodiments for either top-side or bottom-side emission, the backside of the silicon-based substrate is thinned.

In some embodiments of ICLs integrated on silicon-based substrate with a 2$^{nd}$-order DFB grating etched into the top Ge or underlying Si surface, no facets are processed by etching or cleaving because the grating provides strong optical feedback and the coupling coefficient is high enough to provide efficient output of the light via surface emission. In such embodiments, the laser cavity length is determined roughly by the length of the top and bottom contacts that inject current. Self-pumping will provide gain only a little beyond the region of current injection, and reflection by the strong grating (which extends beyond the contact length in many embodiments) limits how much farther light can propagate into sections of the inner ridge that do not produce gain.

In other embodiments, facets are etched at one or both ends of the laser cavity, and one or both facets are HR coated by depositing an insulating dielectric and then a metal on the outer surface of each facet. The HR coatings reflect light reaching the end facets back into the cavity rather than allowing it to escape. Or in other embodiments the cavity is bound at one or both ends by a DBR grating that is stronger (e.g., employing a deeper etch) than the DFB grating which provides distributed feedback within the laser cavity. The DBR will feed light reaching the end back into the cavity to prevent it from escaping.

Although edge emission is required if the ICL of the invention is to function as a source component in a PIC, surface emission can be ideal for individual lasers that are designed for mass production at low-cost. Many thousands of devices can be processed in parallel on a large silicon wafer (e.g., 8-12" diameter), which may involve bonding multiple smaller III-V chips (e.g., grown on 3-6" InP or GaSb substrates) to the same silicon wafer. The mask set used for processing may make all the devices identical, or different lasers may employ differing design parameters such as DFB grating pitch, inner ridge width, and cavity length. A considerable advantage of surface emission for mass-produced lasers is that partially-processed devices can be probe-tested prior to singulation [Iga, *IEEE J. Sel. Topics Quant. Electron* 6, 1201 (2000), "Surface-Emitting Laser-Its Birth and Generation of New Optoelectronics Field"]. This can save the considerable time and expense required to complete the processing and qualification of individual lasers if the probe performance is found to be sub-standard or the devices otherwise do not meet the intended specifications (such as target emission wavelength).

The integrated surface-emitting ICLs of the invention can operate with very low drive power. Simulations project that a $2^{nd}$-order DFB grating with 75% duty cycle and etch depth 10 nm will provide an in-plane coupling coefficient of 53 cm$^{-1}$ to a weakly index-guided ICL embodiment such as that illustrated in FIG. 15 with 5 stages and emission wavelength $\lambda$=3.5 μm, as well as a vertical radiation loss of 1 cm$^{-1}$. In some embodiments a π phase shift is introduced to induce lasing in the symmetric mode that has a significant vertical radiation component. It is then projected that the large grating coupling coefficient can provide sufficient feedback for lasing when the cavity length is as short as ≈300 μm. Assuming an inner ridge width of 4 μm, the simulations project a threshold current density as low as ≈180 A/cm$^{-2}$ for cw operation at room temperature, from which a projected drive power is ≈5 mW is quite feasible. This is more than 5× lower than any result reported to date.

Although the numerical performance projections differ, all of the advantages of very strong coupling coefficient to a $1^{st}$- or $2^{nd}$-order DFB grating etched into the top of the silicon substrate before heterogeneous bonding apply to both structures incorporating a Ge SCL to attain weak index guiding, such as that illustrated schematically in FIGS. 16A and 16B, and heterogeneously-integrated ICLs that are not weakly index guided [Spott 2018, supra].

H. Two-Dimensional Photonic Crystal Surface-Emitting ICLs Integrated on Silicon

In other embodiments, an ICL is integrated on a silicon-based substrate that is pre-patterned with a 2D photonic crystal structure [Noda et al., *IEEEJ. Sel. Topics Quant. Electron.* 23, 4900107 (2017), "Photonic-Crystal Surface-Emitting Lasers: Review and Introduction of Modulated-Photonic Crystals"; Takeda, *Opt. Expr.* 22, 702 (2015), "Heterogeneously Integrated Photonic-Crystal Lasers on Silicon for On/Off Chip Optical Interconnects"; Zhou et al., *Nat. Commun.* 11, 977 (2020), "Continuous-Wave Quantum Dot Photonic Crystal Lasers Grown on On-Axis Si (001)"]. Using designs known to the art, photonic crystal surface-emitting lasers (PCSELs) can provide coherent emission over a broad area, beam steering in the absence of external optical elements, and other attractive properties. For ICLs integrated on a pre-patterned silicon-based substrate, the layer of silicon in which the photonic crystal structure is pre-patterned may serve as the laser's bottom optical cladding layer. In comparison to conventional PCSELs processed on the native III-V substrates, these embodiments combine the advantages of high-quality/high-yield silicon processing of the 2D photonic crystal grating, low thermal resistance between the active ICL gain stages and a heat sink to which the silicon substrate is thermally bonded, and enhanced coupling of the optical mode to the 2D photonic crystal grating, if desired, by incorporating a Ge SCL. However, some embodiments of an integrated ICL PCSEL do not incorporate a Ge SCL.

Although PCSELs have been fabricated previously by heterogeneously bonding a III-V active gain material to a Si-based substrate [Takeda, supra; Zhou, supra], in all of those cases the photonic crystal grating was patterned in the III-V material rather than the underlying silicon-based substrate.

For some applications an external optical beam must be coupled into a hybrid waveguide on a chip, for example an external beam whose spectral properties are to be analyzed by on-chip ICDs. Conventionally, external light is coupled to an on-chip passive waveguide via edge coupling, which requires challenging alignment and often results in low coupling efficiency. Furthermore, it may then be necessary to couple the beam in the passive waveguide to the hybrid waveguide of an ICD. It was pointed out above that the coupling between passive waveguides and active interband cascade waveguides has been quite inefficient to date. Alternatively, some embodiments of the invention use a 2D photonic crystal to couple collimated input light having wavelength within the spectral bandwidth of the photonic crystal grating onto the chip. Input coupling into a 2D photonic crystal grating with lateral dimension comparable to the input beam profile will be more straightforward and efficient than edge coupling. Light input to the 2D photonic crystal grating can then be transferred to a passive waveguide, or if the optical mode in the photonic crystal is concentrated mostly in a Ge SCL transfer to a passive waveguide and then to an ICD hybrid waveguide becomes more efficient.

Advantages and New Features:

The present invention teaches the first practical approach to fabricating weakly-index-guided interband cascade lasers that maintain high power conversion efficiency by eliminating parasitic current spreading. Because the weak index guiding is provided by concentration of the mode in a high-index GaSb or Ge separate confinement layer, a double-ridge waveguide can be defined by an etch of the inner ridge that stops below the active stages, thus preventing the spread of current into regions that do not produce gain or generate photons. Weak index guiding allows a wider ICL inner ridge to emit a high-quality beam, by inducing greater discrimination between the optical confinement factors for the fundamental vs. higher-order lateral modes. Optical waveguide losses are also minimized, because the lightly-n-doped GaSb or lightly-n-doped Ge SCL, in which a large fraction of the optical mode is concentrated, contributes minimal free carrier absorption. Optical waveguide losses are also reduced since scattering losses due to processing imperfections and other non-uniformities at the inner ridge sidewalls are minimized. This is because the mode concentrated in the SCL has reduced vertical overlap with the inner ridge sidewall, and because the mode in a wider inner ridge experiences less interaction with the sidewalls.

For embodiments of the invention in which ICL wafer material is heterogeneously bonded to a silicon-based substrate, the invention provides excellent heat dissipation without the expense and reduced yield of epitaxial-side-down mounting or flip-chip bonding. This is because the silicon substrate is thermally bonded to a heat sink that is separated from the III-V active gain stages only by very thin contact and bonding layers and then Ge and Si layers that have much higher thermal conductivity than all of the III-V constituents. The efficient heat dissipation will allow integrated ICLs to operate in cw mode with higher wallplug efficiency. It should be noted that in many embodiments, single-crystal Ge is preferred, but is not necessary.

These features of the invention will be especially advantageous when applied to ICLs emitting at longer wavelengths, e.g., ≥4.5 μm. At longer wavelengths, the performance of ICLs incorporating conventional InAs—AlSb superlattice top and bottom cladding layers comes to be limited in part by thermal resistance and optical loss associated with the cladding whose nominal thickness scales linearly with wavelength. It also becomes impractical to grow structures with extremely thick cladding layers, and to etch a high-quality top DFB grating that is deep enough to strongly couple to the optical mode.

An alternative approach is to replace some or all of the InAs—AlSb superlattice cladding layer with a heavily-n-doped InAs or InAsSb layer, which is lattice matched to the InAs or GaSb substrate and provides plasma confinement of the lasing mode [Tian et al., *Electron. Lett.* 45, 48 (2009), "InAs-Based Interband Cascade Lasers Near 6 m"; Li et al., J. Cryst. Growth 425, 369 (2015), "MBE-Grown Long-Wavelength Interband Cascade Lasers on InAs Substrates"; Dallner et al., *Appl. Phys. Lett.* 106, 041108 (2015); 107, 181105 (2015); Canedy et al., Proc. *SPIE* 10111, 10111-0G (2017), "Interband Cascade Lasers with Longer Wavelengths"]. However, while plasma-based designs have allowed thinner cladding layers to provide sufficient optical confinement at emission wavelengths as long as 11 μm [Li et al., supra], the minimum cladding thickness is still ≈2 μm, the heavy doping of the InAs or InAsSb introduces additional optical loss, and for DFB operation there is still a trade-off between higher loss for a top grating and weaker coupling coefficient for a side grating. Consequently, the longest wavelength for which room temperature pulsed operation has been reported is 7.0 μm [Dallner et al. 106, supra], while cw single-mode emission at 5.9 μm was observed up to −10° C. [Dallner et al. 107, supra]. ICLs reported by the University of Oklahoma lased in cw mode up to 166 K for emission at 10.4 μm, and up to 97 K at 11.0 μm [Li et al., supra].

Embodiments of the invention that provide weak-index-guiding by concentrating a substantial fraction of the optical mode in a Ge SCL which is adjacent to a strong DFB grating etched into a silicon substrate have the advantage of providing mode confinement without introducing a thick cladding layer. This avoids any substantial thermal resistance between the active stages and the heat sink. Furthermore, at longer wavelengths the optical loss for a mode concentrated largely in Ge and Si layers [Soref et al., *J. Opt. A* 8, 840 (2006), "Silicon waveguided components for the long-wave infrared region"] will be substantially lower than that induced by a heavily-doped plasma confinement layer. It is anticipated that the resulting ICLs will operate cw in a single spectral mode at room temperature for wavelengths out to and beyond 10 μm. Such devices with low drive power budget may be expected to replace QCLs in many longer-wavelength spectroscopic applications for which high output powers are not required.

Embodiments of the invention in which an ICL wafer material is heterogeneously bonded to a silicon-based substrate have the flexibility of being suitable for both edge-emitting and surface emitting applications. In some embodiments, large numbers of inexpensive edge-emitting or surface-emitting lasers are mass-produced in parallel and then singulated to provide low-cost individual IR emitters. In other embodiments, the output from an edge-emitting ICL couples to a passive waveguide for functionality as a source element in an MWIR photonic integrated circuit. In that case, the lower vertical profile of the optical mode resulting from its concentration primarily in a Ge SCL will substantially increase the efficiency for coupling the output from a hybrid III-V/Ge/Si active waveguide into a passive silicon waveguide, for example induced by tapering the hybrid waveguide, as compared to the weak waveguide transfer efficiency demonstrated to date for conventional ICLs integrated on silicon from the prior art [Spott 2018, supra].

Embodiments of the invention in which ICLs heterogeneously integrated on silicon can emit from the top and/or bottom surface of the integrated device when the top surface of the silicon substrate is patterned with a $2^{nd}$-order DFB or photonic crystal grating. Surface emission has the advantages of simpler processing of devices without end facets, and also much more economical probe-testing at the wafer level before individual devices are fully processed and singulated. The surface-emitting or edge-emitting ICLs processed on a single chip can be identical for inexpensive mass production of lasers operating at a commercially-useful wavelength, or the laser parameters such as the inner ridge width, cavity length, and grating pitch (which governs the emission wavelength) can be varied from device to device to provide simultaneous processing of lasers having a range of properties.

Both edge-emitting and surface-emitting embodiments that incorporate gratings are advantageous because the grating etched into the silicon-based substrate before heterogeneous bonding can have much higher quality than a grating etched into the epitaxial III-V material of a conventional ICL processed on the native substrate. A further advantage is that some embodiments of the invention provide enhanced overlap of the optical mode with the grating to provide much larger coupling coefficients than are practical for conventional DFB and PCSEL ICLs fabricated on the native III-V substrates. Besides assuring high spectral selectivity, a very large coupling coefficient can also induce sufficient internal optical feedback that the ICL cavity can be much shorter than is practical to fabricate using conventional methods for processing and cleaving on the native III-V substrate. Besides minimizing the size of individual devices so a larger number can be mass-produced in parallel on the same silicon chip, the drive power needed to operate an ultra-short laser cavity with strong internal feedback is much lower than has been demonstrated to date by conventional ICLs processed on the native III-V substrates. Consequences will include smaller package footprints for handheld optical systems, longer battery lifetimes for remote and inaccessible systems that are inconvenient to maintain frequently, and systems powered by solar energy.

Other embodiments of the invention suppress sidewall leakage in ICLs integrated on silicon. The severe leakage in devices from the prior art [Spott Optica 2018, supra] has been associated with surface electron accumulation at the ridge sidewalls of structures containing InAs-based quantum wells. Embodiments of the invention reduce the surface electron density by applying a positive gate bias, which may be the same voltage as that applied to the bottom contact of the ICL, to the metal surrounding the dielectric insulating layer that coats the inner ridge sidewalls. The surface leakage suppression is greatest if the dielectric thickness at the sidewalls is minimized.

Some embodiments of the invention are ideally suited for the integration of ICLs on silicon chips that are pre-patterned with photonic crystal surface-emitting laser gratings. Advantages include mature and high-yield silicon-based processing of the intricate photonic crystal patterns, concentration of the mode in a Ge SCL for strong coupling to the photonic crystal, and excellent thermal dissipation to the heat sink via the silicon-based substrate.

Alternatives:

Numerous alternatives falling within the scope of the invention will be obvious to one skilled in the art. For example, the ICL substrate may be InAs rather than GaSb, and the ICL gain stages may employ radiative transitions in either type-II or type-I active quantum wells. The compositions and thicknesses of the various optical cladding layers, SCLs, active and injector quantum well compositions, transition superlattices, and contacting layers may employ numerous variations besides those specified for the exemplary structures illustrated in the figures and discussed above. Many of the layers may also employ alloy constituents different from those specified in the exemplary embodiments. For example, the SCL layer in an ICL may be an $Al_xGa_{1-x}Sb$ ternary alloy rather than GaSb, or the cladding layers of an ICL may be an InAlAsSb quaternary alloy rather than an InAs—AlSb superlattice. The metals and dielectrics employed may also vary. Gold electro-plating of the top of the structure may optionally be applied to most of the embodiments.

The Ge layer used as the SCL in embodiments of weakly-index-guided ICLs integrated on silicon may be replaced by some other high-index material such as a GeSi alloy. For photonic integrated circuit applications that require efficient coupling of the hybrid active waveguide to a passive silicon waveguide, other means besides tapering may be used to provide the coupling. For example, the beams in hybrid active and passive silicon waveguides may be transferred by butt-coupling or evanescent lateral coupling [Meyer 2019, supra], in which cases the lower vertical profile of the optical mode concentrated in the Ge SCL of the weakly-index-guided structure will be equally beneficial to the coupling efficiency.

ICLs integrated on silicon by heterogeneous bonding may attain weak index guiding by thickening the top GaSb SCL and eliminating the bottom SCL, following an approach similar to that for embodiments processed on the native GaSb substrate, or by replacing the GaSb SCL with a Ge SCL. The Ge SCL is often preferred because the higher thermal conductivity of Ge provides lower thermal resistance to the heat sink, but other materials or configurations may be possible.

Most embodiments of the invention may be mounted epitaxial-side-down for maximum heat dissipation, or epitaxial-side-up for simpler processing. Even though the embodiments of ICLs integrated on silicon provide efficient thermal dissipation via the silicon-based substrate, flip-chip bonding can provide additional thermal dissipation.

Many of the inventive features, such as those that provide weak index guiding, are suitable for both surface-emitting (induced by a $2^{nd}$-order DFB or 2D PCSEL grating) and edge-emitting lasers. The cavities for both edge-emitting and surface-emitting lasers may be defined by mirrors at one or both ends, comprising etched or cleaved facets, notches or some other means to induce a longitudinal variation of the refractive index, or DBRs. Each facet may be either coated for high-reflectivity or anti-reflection, or left uncoated. For some embodiments that provide strong internal feedback by etching a deep grating etched into a pre-patterned silicon-based substrate, no facets or other means to induce reflection at the ends of the cavity are needed.

For embodiments integrated on silicon, a DFB grating, DBR grating, photonic crystal grating, or other patterned structure may be etched either into the Ge SCL or into the top of the underlying silicon substrate. In the case of etching into the Ge SCL, the etch may be shallow to maintain a higher effective refractive index than the active core so as to be suitable for weak index guiding, or deep to provide very strong coupling of the optical mode to the grating. For embodiments that involve heterogeneous bonding to a silicon-based substrate, ICLs can employ a flat silicon bottom clad because the refractive index of silicon is lower than the weighted index of the constituents forming the III-V portion of the hybrid waveguide.

The exemplary embodiments of the invention discussed above focused on ICLs, since thus far the lateral current spreading in those structures has precluded weakly-index-guided operation with high wallplug efficiency. However, some inventive aspects are equally applicable to other classes of semiconductor lasers integrated on silicon. For example, Ge SCLs may be incorporated to provide weak index-guiding of InP- or GaAs-based quantum cascade lasers, non-cascade GaSb-based diode lasers, nitride lasers, and other semiconductor laser classes that employ a variety of material systems. Even if the modal index in the given laser material is lower than that of silicon, a silicon bottom clad layer may be employed as long as its fill factor is reduced by pre-patterning a DFB, photonic crystal, or non-resonant grating in the top of the silicon substrate. Again, care must be taken to etch the grating deeply enough to prevent leakage into the underlying bulk silicon. As in the case of the exemplary ICL embodiments discussed above, advantages may include high-yield processing of weakly-index-guided devices, strong coupling to a high-quality grating, surface emission when the grating is of second-order or a photonic crystal, and efficient heat dissipation via the silicon substrate.

Some embodiments of the invention may also be used in conjunction with more complex laser cavities that are divided into multiple regions. For example, weak index guiding with either a GaSb or Ge SCL may be used in conjunction with ICL frequency combs that divide the laser cavity into gain and saturable absorber sections. Weak index guiding with a Ge SCL may be used as the active portion of an integrated external cavity ICL PIC, where light is coupled from the ICL gain region into a passive Ge waveguide where it enters and returns from additional waveguide-based elements (e.g. coupled ring resonator reflectors, loop mirrors, DBR reflectors), forming a resonant cavity with both passive and active regions. In this case, the weak index guiding active region includes no internal feedback (e.g. DFB gratings) and depends on the other passive PIC elements to form a laser cavity. Such a PIC may form a tunable or narrow linewidth laser.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A weakly index-guided interband cascade laser (ICL), comprising:
  a silicon substrate;
  a high-index layer disposed on an upper surface of the silicon substrate;
  an n+ contact layer disposed on an upper surface of the high-index layer; and
  an inner laser ridge disposed on an upper surface of the n+ contact layer, the inner laser ridge comprising:

a plurality of active ICL stages formed on an upper surface of the n+ contact layer;

an n-type upper cladding layer formed on an upper surface of the active ICL stages; and an n+ top contact layer;

wherein a refractive index of the n-type upper cladding layer is lower than a refractive index of the high-index layer;

wherein the high-index layer is sufficiently thick that a sufficient fraction of a fundamental lateral optical mode profile lies below an etch depth of the inner laser ridge to impose weak index guiding on at least one prede-termined optical mode in the weakly index-guided ICL; and wherein the inner laser ridge is not so wide that significant lasing occurs in higher-order lateral modes.

2. The weakly index-guided interband cascade laser (ICL) according to claim 1, wherein the high-index layer com-prises a high-index n-type layer, the weakly index-guided ICL further comprising:

an n-type lower cladding layer disposed on the high-index n-type layer; and a high-index n-type separate confinement layer (SCL) disposed on the n-type lower cladding layer;

wherein a refractive index of the n-type upper cladding layer is lower than a refractive index of the high-index n-type SCL;

wherein a refractive index of the n-type lower cladding layer is lower than a refractive index of the high-index n-type SCL; and wherein the high-index n-type SCL is sufficiently thick that a sufficient fraction of the fundamental lateral optical mode profile lies below the etch depth of the inner laser ridge to impose weak index guiding on at least one predetermined optical mode in the laser waveguide.

3. The weakly index-guided ICL according to claim 1, wherein the high-index layer comprises an n-type GaSb buffer layer.

4. The weakly index-guided ICL according to claim 2, wherein the n-type lower cladding layer comprises n-type InAs—AlSb and the high-index n-type SCL comprises an n-type GaSb SCL.

5. A weakly index-guided interband cascade laser (ICL) comprising:

a Si-based substrate comprising a silicon layer and a high-index separate confinement layer (SCL) formed on top of the silicon layer;

a III-V gain chip disposed epitaxial-side-down on top of the Si-based substrate, the III-V gain chip comprising:

a GaSb or InAs substrate;

an etch-stop layer disposed on an upper surface of the GaSb or InAs substrate;

a sacrificial layer disposed on an upper surface of the etch-stop layer;

a first n+ contact layer disposed on an upper surface of the sacrificial layer;

an n-type cladding layer disposed on an upper surface of the first n+ contact layer;

a plurality of active ICL stages disposed on an upper surface of the n-type cladding layer; and a second n+ contact layer;

a portion of the GaSb or InAs substrate of the III-V gain chip, the etch-stop layer, and the sacrificial layer being removed by a combination of mechanical lapping and chemical etches, followed by etching of an inner laser ridge to a depth near to a bottom or below a bottom of the active ICL stages;

wherein the active ICL stages have a refractive index higher than a refractive index of the n-type cladding layer;

wherein the high-index SCL has a refractive index higher than that of the n-type cladding layer of the III-V gain chip and of at least one underlying layer in the Si-based substrate;

wherein the high-index SCL is sufficiently thick that a sufficient fraction of a fundamental lateral optical mode profile lies below the active ICL stages to impose weak index guiding on at least one predetermined optical mode in the weakly index-guided ICL; and wherein the inner laser ridge is not so wide that significant lasing occurs in higher-order lateral modes.

6. The weakly-index-guided ICL of claim 5, wherein one or more layers in the silicon-based substrate is pre-patterned with a distributed feedback (DFB), distributed Bragg reflec-tor (DBR), discrete mode (DM), photonic crystal, or other grating before the III-V gain chip is disposed thereon.

7. The weakly-index-guided ICL of claim 5, wherein:

the high-index SCL is pre-patterned with a distributed feedback (DFB) grating; and the DFB grating is pre-patterned in portions of the high-index SCL in portions of an outer ridge that are lateral to each side of the inner ridge.

8. The weakly-index-guided ICL of claim 5, wherein an upper surface of the Si-based substrate is patterned to incorporate at least one taper to a narrower Si-based passive waveguide.

9. The weakly-index-guided ICL of claim 5, wherein a grating etched into one or more layers of the Si-based substrate provides feedback that is sufficiently strong that no end facets are required to form a laser cavity.

10. The weakly-index-guided ICL of claim 5, wherein a grating etched into one or more layers of the Si-based substrate is a 2nd-order DFB grating that provides surface emission from a laser cavity.

11. The weakly-index-guided ICL of claim 5, wherein:

the high-index SCL comprises single-crystal Ge;

the substrate of the III-V gain chip comprises GaSb;

the etch-stop layer comprises InAsSb;

the sacrificial layer comprises GaSb;

the first $n^+$ contact layer comprises n+ InAsSb;

the n-type cladding layer comprises an n-type InAs—AlSb superlattice; and the second n+ contact layer comprises n+ InAs(Sb).

12. A cascade laser comprising:

a substrate comprising a silicon layer;

a high-index layer on the silicon layer;

a first n+ contact layer on the high-index layer, wherein the high-index layer is between the substrate and the first n+ contact layer;

a laser ridge on the first n+ contact layer, wherein the first n+ contact layer is between the high-index layer and the laser ridge, wherein the first n+ contact layer extends beyond opposite sides of the laser ridge, and wherein the laser ridge includes, a plurality of active cascade laser stages on the first n+ contact layer, wherein the first n+ contact layer is between the high-index layer and the plurality of active cascade laser stages, an n-type cladding layer on the plurality of active cascade laser stages, wherein the plurality of active cascade laser stages is between the first n+ contact layer and the n-type cladding layer, and wherein a refractive index of the high-index layer is greater than a refractive index of the n-type cladding layer, and a second n+ contact layer, wherein the plurality of active cascade laser stages is between the n-type cladding layer and the second n+ contact layer.

13. The cascade laser according to claim 12, wherein the n-type cladding layer comprises a second n-type cladding layer, the cascade laser further comprising:

a first n-type cladding layer between the high-index layer and the first n+ contact layer;

wherein the high-index layer comprises a high-index n-type separate confinement layer (SCL), and wherein the refractive index of the high-index SCL is greater than a refractive index of the first n-type cladding layer.

14. The cascade laser according to claim 13, wherein the first n-type cladding layer comprises n-type InAs—AlSb, and the high-index n-type SCL comprises n-type GaSb.

15. The cascade laser according to claim 12, wherein the high-index layer comprises an n-type GaSb buffer layer.

16. The cascade laser according to claim 12, wherein the cascade laser is configured to generate a laser output at a wavelength, and wherein the n+ contact layer extends at least a few multiples of the wavelength of the laser output beyond opposite sides of the laser ridge.

17. The cascade laser according to claim 12, wherein the high-index layer comprises a high-index separate confinement layer (SCL).

18. The cascade laser according to claim 12, wherein the refractive index of the high-index layer is greater than a refractive index of the silicon layer of the substrate.

19. The cascade laser according to claim 12, wherein the refractive index of the n-type cladding layer is less than a refractive index of the plurality of active cascade laser stages.

20. The cascade laser according to claim 12, wherein the laser ridge is sufficiently narrow to suppress lasing in higher-order lateral modes.

21. The cascade laser according to claim 12, wherein the high-index layer has a sufficient thickness to provide that a sufficient fraction of a fundamental lateral optical mode profile lies in the substrate and/or the high-index layer to impose weak index guiding on at least one optical mode in the cascade laser, and wherein the laser ridge is not so wide that significant lasing occurs in higher order lateral modes.

* * * * *